(12) United States Patent
Iga et al.

(10) Patent No.: US 7,792,173 B2
(45) Date of Patent: Sep. 7, 2010

(54) SEMICONDUCTOR LASER DEVICE

(75) Inventors: Yoshihiko Iga, Hitachinaka (JP); Yutaka Inoue, Komoro (JP); Hiroshi Moriya, Ushiku (JP); Yasuhisa Semba, Saku (JP); Susumu Sorimachi, Komoro (JP)

(73) Assignee: Opnext Japan, Inc., Yokohama-shi (JP)

( * ) Notice: Subject to any disclaimer, the term of this patent is extended or adjusted under 35 U.S.C. 154(b) by 34 days.

(21) Appl. No.: 12/328,186

(22) Filed: Dec. 4, 2008

(65) Prior Publication Data

US 2009/0147816 A1   Jun. 11, 2009

(30) Foreign Application Priority Data

Dec. 6, 2007  (JP)  ............................. 2007-315443
Jun. 30, 2008  (JP)  ............................. 2008-169794

(51) Int. Cl.
*H01S 5/00*  (2006.01)

(52) U.S. Cl. .............. 372/50.12; 372/44.01; 372/43.01; 372/50.1

(58) Field of Classification Search .............. 372/50.12, 372/43.01, 44.01
See application file for complete search history.

(56) References Cited

U.S. PATENT DOCUMENTS 7,443,901 B2  10/2008  Inoue et al.
7,616,674 B2 * 11/2009 Ryu et al. .............. 372/50.122
2006/0109883 A1 * 5/2006 Lewis et al. .............. 372/50.12

FOREIGN PATENT DOCUMENTS

JP  07-202323 A  8/1995
JP  2002-246696 A  8/2002

OTHER PUBLICATIONS

Fritz et al., "Cooling Rate in Diode Laser Bonding", IEEE Transactions on Components and Packaging Technologies, vol. 27, No. 1, pp. 147-154, Mar. 2004.

* cited by examiner

*Primary Examiner*—Dung T Nguyen
(74) *Attorney, Agent, or Firm*—Miles & Stockbridge P.C.

(57) ABSTRACT

In a multi-beam semiconductor laser device, relative difference in shear strain applied to each of light-emitting portions of a laser chip mounted on a submount is suppressed, thereby reducing relative difference in polarization angle. A semiconductor laser element array mounted on a submount has a structure in which a semiconductor layer having two ridge portions is stacked on a substrate, and Au plating layers are formed on the surfaces of p type electrodes formed on the ridge portions. In each of the ridge portions, a central position of the Au plating layer in a width direction is intentionally displaced with respect to a central position of the underlying light-emitting portion in a width direction, so that shear strain is applied to each of the light-emitting portions at a stage before the semiconductor laser element array is mounted on the submount.

11 Claims, 22 Drawing Sheets

SEMICONDUCTOR LASER DEVICE

CROSS-REFERENCE TO RELATED APPLICATION

The present application claims priority from Japanese Patent Application No. JP 2007-315443 filed on Dec. 6, 2007 and Japanese Patent Application No. JP 2008-169794 filed on Jun. 30, 2008, the contents of which are hereby incorporated by reference into this application.

TECHNICAL FIELD OF THE INVENTION

The present invention relates to a semiconductor laser device, and more particularly to a technique effectively applied to a multi-beam semiconductor laser device.

BACKGROUND OF THE INVENTION

With the increasing demand for the higher printing speed in the plain paper copier (PPC) and the laser printer, the needs for the multi-beam semiconductor laser device have been rapidly increasing. Since the multi-beam semiconductor laser device has light-emitting portions arranged single-dimensionally or two-dimensionally, the number of scanning beams can be increased, and thus it has the advantage that the high-speed printing can be achieved.

The general structure of the multi-beam semiconductor laser device will be described with reference to FIG. 1. FIG. 1 shows a four-beam semiconductor laser device as an example of the multi-beam semiconductor laser device. As shown in FIG. 1, a semiconductor laser element array (laser chip) 8 including a semiconductor substrate 11 made of GaAs or the like (hereinafter, simply referred to as substrate), a semiconductor layer 2 having light-emitting portions 7 arranged in an array, an n type electrode 1 and p type electrodes 3 separated into stripes is bonded with solders 4 on submount electrodes 5 formed into stripes on a submount 6. A metal layer 10 for heat dissipation made of Au plating or the like is formed on each surface of the p type electrode 3.

The submount 6 is bonded to a heat sink (not shown) made of Cu via solder or others. The submount 6 has a function to relax the thermal stress caused by the difference in a linear expansion coefficient between the heat sink and the semiconductor laser element array 8 and improve the heat dissipation. Therefore, a material having high thermal conductivity and a thermal expansion coefficient close to that of the substrate 11, for example, SiC, Si, CuW or AlN is used as a material of the submount 6.

The above-mentioned mounting method in which the light-emitting portions 7 of the substrate 11 are directed to the submount 6 side is called a junction-down mounting, and this method has an advantage of efficiently dissipating the heat generated in the light-emitting portions 7 to the submount 6. However, it has been known that since stress is likely to be applied to the bonding portion between the substrate 11 and the submount 6 in this junction-down mounting, strain is applied to the light-emitting portions 7 due to the thermal stress at the time of mounting, which causes the variations in optical properties. In particular, since it is required to realize the laser elements having uniform optical properties by reducing the relative difference in properties of each beam such as wavelength, polarization angle, light-emission efficiency and optical output in the case of the multi-beam semiconductor laser device, it is an important issue to reduce the relative difference in strain applied to the light-emitting portions by reducing the thermal stress at the time of mounting.

However, when the multi-beam semiconductor laser device in which light-emitting portions are arranged single-dimensionally is fabricated, the polarization directions of the beams are varied and the relative difference in polarization angle (rotation of the angle of polarization plane with respect to a plane parallel to an active layer in a semiconductor layer) occurs. Further, it is known that when the shear strain is applied to the semiconductor layer, the polarization direction of the beam is rotated in proportion to this shear strain (M. A. Fritz, IEEE Trans. Comp. Package. Technol., 27 (2004) p. 147), and it is considered that the above-mentioned relative difference in polarization angle is caused by the relative difference in shear strain in each of the light-emitting portions.

The above-mentioned relative difference in shear strain will be described with reference to FIG. 1 to FIG. 3. Note that the case where a linear expansion coefficient of the substrate 11 is larger than that of the submount 6 will be described here.

The semiconductor laser element array (laser chip) 8 is bonded to the submount 6 with the solders 4 made of Au—Sn or the like under the temperature of 200° C. to 300° C. When the temperature falls to ambient temperature after the solder bonding (after mounting), since the submount 6 contracts less than the substrate 11 (has a smaller linear expansion coefficient), the semiconductor layer 2 is pulled outwardly in a horizontal direction on the p type electrode 3 side near the submount 6, but the semiconductor layer 2 contacts inwardly in a horizontal direction on the n type electrode 1 side (see FIG. 2). The horizontal direction mentioned here is defined as a direction parallel to the bonding surface between the semiconductor layer 2 and the substrate 11, and the vertical direction is defined as a direction vertical to the bonding surface between the semiconductor layer 2 and the substrate 11, in other words, a direction vertical to a resonator direction of the semiconductor laser element array 8.

Parallelograms shaded with hatching in FIG. 2 show the state of shear deformation of each of the light-emitting portions 7, and FIG. 3 shows the plotted shear strains of the light-emitting portions 7. Note that the light-emitting portions 7 are numbered as LD1, LD2, . . . in order from the left end in FIG. 2 and FIG. 3. As is evident from FIG. 3, the magnitude of the vertical and horizontal shear strain after the mounting differs in each of the light-emitting portions 7, and relative difference in shear strain occurs. Note that, when the linear expansion coefficient of the substrate 11 is smaller than that of the submount 6, plus and minus of the shear strain in the light-emitting portions 7 are reversed in FIG. 3. As described above, since different shear strains are applied to each of the light-emitting portions 7 after the mounting, the polarization angles of the beams differ and the relative difference in polarization angle (difference in polarization angle between beams) occurs in the multi-beam semiconductor laser device.

As a method of suppressing the rotation of the polarization angle and a method of reducing the strain applied to the light-emitting portions after the mounting described above, Japanese Patent Application Laid-Open Publication No. 2002-246696 (patent document 1) has suggested the means for addressing the displacement of a polarization direction of a laser light with respect to a direction parallel to an active layer of a laser chip. In this suggestion, a light-projecting point is located at a position intentionally displaced from a central position of a chip in a width direction, thereby addressing the displacement of the polarization direction.

Also, Japanese Patent Application Laid-Open Publication No. 07-202323 (patent document 2) has suggested the means for obtaining the multi-beam semiconductor laser device having uniform optical properties. In this suggestion, a pseudo laser element which does not emit light at the time of use is formed outside the region where a plurality of semiconductor laser elements are formed, and this pseudo laser element is made to absorb the thermal stress, thereby obtaining the multi-beam semiconductor laser device having uniform optical properties.

SUMMARY OF THE INVENTION

According to the studies by the inventors of the present invention, the suggestion described in the patent document 1 cannot be applied to a multi-beam semiconductor laser in which a plurality of light-emitting points arranged at regular intervals are provided on one semiconductor substrate and polarization angles of the beams are different from each other. Further, the investigations by the inventors of the present invention have found out that the method of forming the pseudo laser element described in the patent document 2 can reduce the relative difference in direct strain but cannot achieve the sufficient reduction effect of the relative difference in shear strain shown in FIG. 2 and FIG. 3.

Further, according to the studies by the inventors of the present invention, when a laser chip is mounted on a submount via solder, the variation in polarization angle of the beams is caused also by the nonuniformity in solder wettability at the interface between an Au plating layer and the solder of the laser chip.

An object of the present invention is to provide a multi-beam semiconductor laser in which the relative difference in polarization angle (difference in polarization angle between beams) is reduced by suppressing the relative difference in shear strain applied to the light-emitting portions after mounting.

The above and other objects and novel characteristics of the present invention will be apparent from the description of this specification and the accompanying drawings.

The typical ones of the inventions disclosed in this application will be briefly described as follows.

(1) A semiconductor laser device according to an invention in this application comprises: a semiconductor laser element array with a multi-beam structure including a semiconductor substrate, a cathode electrode of a first conductivity type formed on a first surface of the semiconductor substrate, a semiconductor layer formed on a second surface of the semiconductor substrate and having a plurality of light-emitting portions therein, anode electrodes of a second conductivity type formed above each of the plurality of light-emitting portions, and metal layers formed on each surface of the anode electrodes, wherein each of the metal layers is boned to a first surface of a submount via a bonding material, thereby mounting the semiconductor laser element array on the submount, and central positions of the metal layers in a width direction are intentionally displaced with respect to central positions of the underlying light-emitting portions in a width direction.

(2) A semiconductor laser device according to an invention in this application comprises: a semiconductor chip with a multi-beam structure including a semiconductor substrate, a cathode electrode of a first conductivity type formed on a first surface of the semiconductor substrate, a semiconductor layer formed on a second surface of the semiconductor substrate and having a plurality of light-emitting portions therein, anode electrodes of a second conductivity type formed above each of the plurality of light-emitting portions, and plating layers for heat dissipation formed on each surface of the anode electrodes, wherein each of the plating layers is boned to a first surface of a support substrate via solder, thereby mounting the semiconductor chip on the support substrate, and a metal layer made of a material having wettability to the solder is interposed at a part of an interface between the plating layer and the solder, and a barrier metal layer made of a material having no wettability to the solder is interposed at the other part of the interface.

The effects obtained by typical one of the inventions disclosed in this application will be briefly described below.

In the multi-beam semiconductor laser device according to the present invention, since the central positions of the metal layers in a width direction are intentionally displaced with respect to central positions of the light-emitting portions in a width direction, the shear strain in a direction opposite to that after the mounting can be applied in advance to the light emitting portions at the stage of the semiconductor laser element array before the mounting, and the shear strain after the mounting can be reduced. More specifically, since the shear strain as shown in FIG. 2 and FIG. 3 is applied by the mounting to the light-emitting portions when the linear expansion coefficient of the substrate 11 is lager than the linear expansion coefficient of the submount 6, the metal layers 10 are arranged so that a center 24 of each metal layer 10 is located inwardly with respect to a center 23 of the corresponding light-emitting portion as shown in FIG. 4. Since the metal layer 10 has a linear expansion coefficient lager than that of the semiconductor layer 2, the metal layer 10 contracts more than the semiconductor layer 2 when plating formation is performed at high temperature and then it is reduced to ambient temperature. Due to the contact of the metal layer 10, the shear deformation like the parallelogram shaded with hatching in FIG. 4 occurs in each of the light-emitting portions. By this means, the shear strain in a direction opposite to that of the shear strain caused by the mounting (see FIG. 2) can be applied in advance at the stage of the semiconductor laser element array 8 before the mounting, and the shear strain after the mounting can be reduced. In this manner, the relative difference in polarization angle due to the relative difference in shear strain can be reduced.

Note that, when an output direction of laser light is defined as a z direction, a direction vertical to an interface between a semiconductor substrate and a semiconductor layer and having a plus direction thereof toward the semiconductor substrate from the semiconductor layer is defined as a y direction, and a direction vertical to the y direction and the z direction and forms a right hand coordinate system is defined as an x direction, the shear strain mentioned above is the shear strain in an x-y plane.

Furthermore, by controlling the ratio of "contact area between a metal layer and solder:contact area between a barrier metal layer and solder" for each of the light-emitting portions, the beam position dependency of the polarization angle is cancelled, and therefore, the multi-beam semiconductor laser device in which the difference in polarization angle between beams is reduced can be realized.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference numbers throughout the drawings for describing the embodiments, and the repetitive description thereof will be omitted. Also, in the following embodiments, the description of the same or similar components is not repeated in principle except the case where the description is particularly required.

First Embodiment

Figure 6:
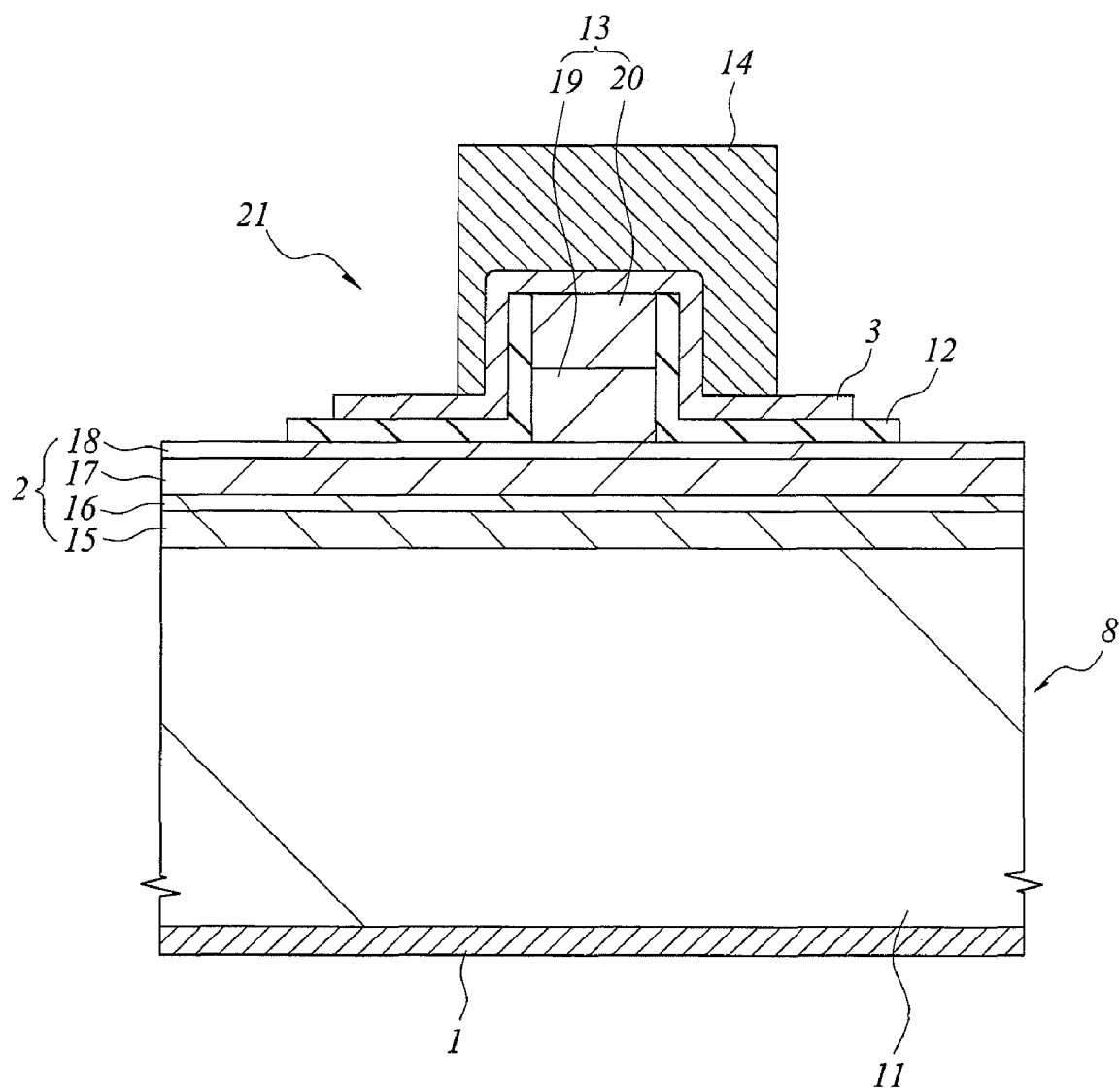
FIG. 6 is a partially enlarged cross-sectional view showing the chip structure of the multi-beam semiconductor laser device according to an embodiment of the present invention.
Figure 7:
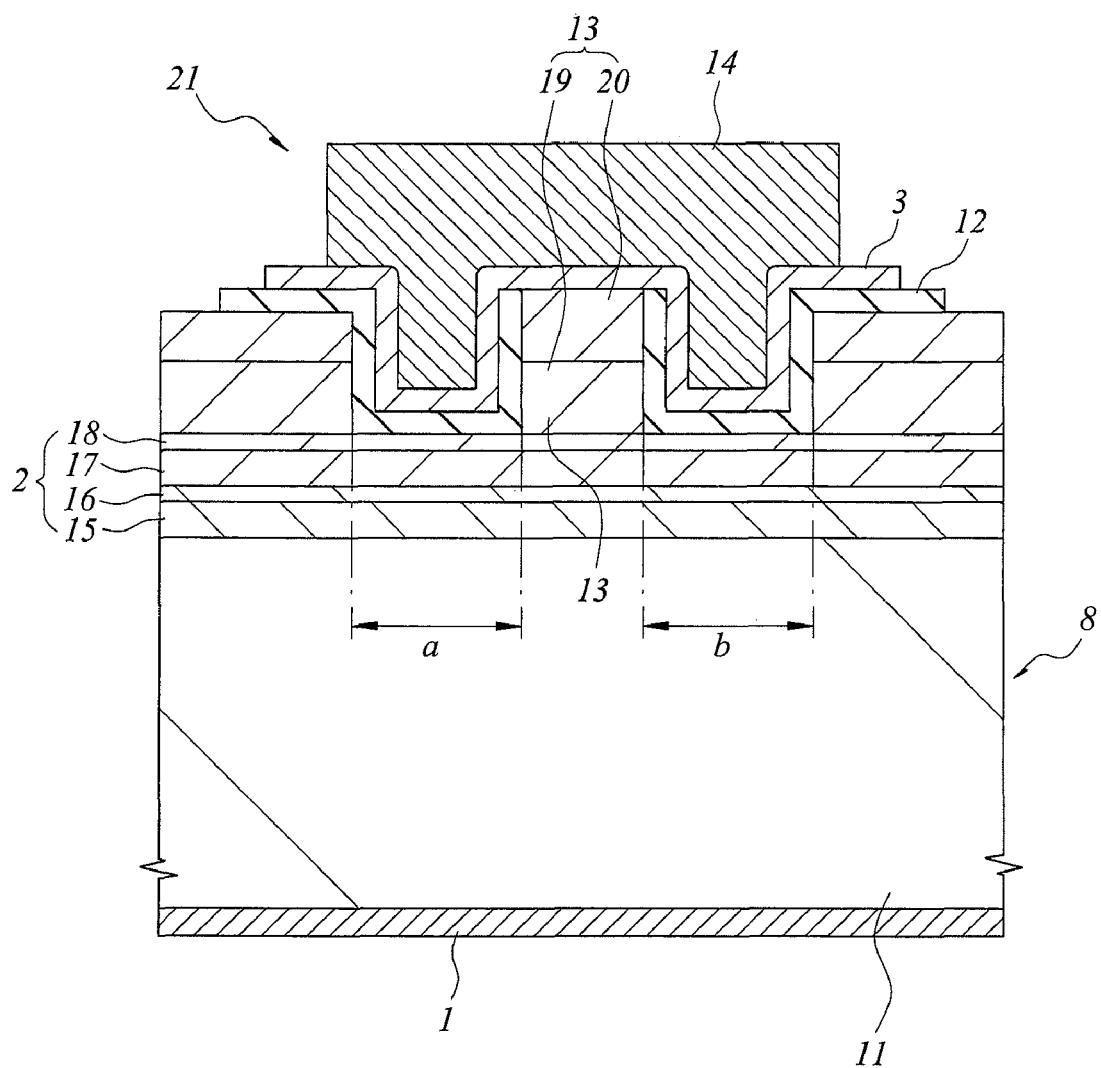
FIG. 7 is a partially enlarged cross-sectional view showing another example of the chip structure of the multi-beam semiconductor laser device according to the present invention.

In this embodiment, the case where the present invention is applied to a multi-beam semiconductor laser device having a plurality of convex ridge portions will be described. FIG. 5 to FIG. 11 are diagrams related to the multi-beam semiconductor laser device according to the present embodiment, in which FIG. 5 and FIGS. 8 to 11 are partial cross-sectional views schematically showing the multi-beam semiconductor laser device and FIG. 6 and FIG. 7 are partially enlarged cross-sectional views of the multi-beam semiconductor laser device.

In the semiconductor laser device of the present embodiment, the linear expansion coefficient of the substrate 11 is larger than the linear expansion coefficient of the submount 6, and GaAs (linear expansion coefficient=$6.4\times10^{-6}$/K) is selected as the substrate 11 and SiC (linear expansion coefficient=$4.0\times10^{-6}$/K) or AlN (linear expansion coefficient=$4.8\times10^{-6}$/K) is selected as the submount 6.

Figure 5:
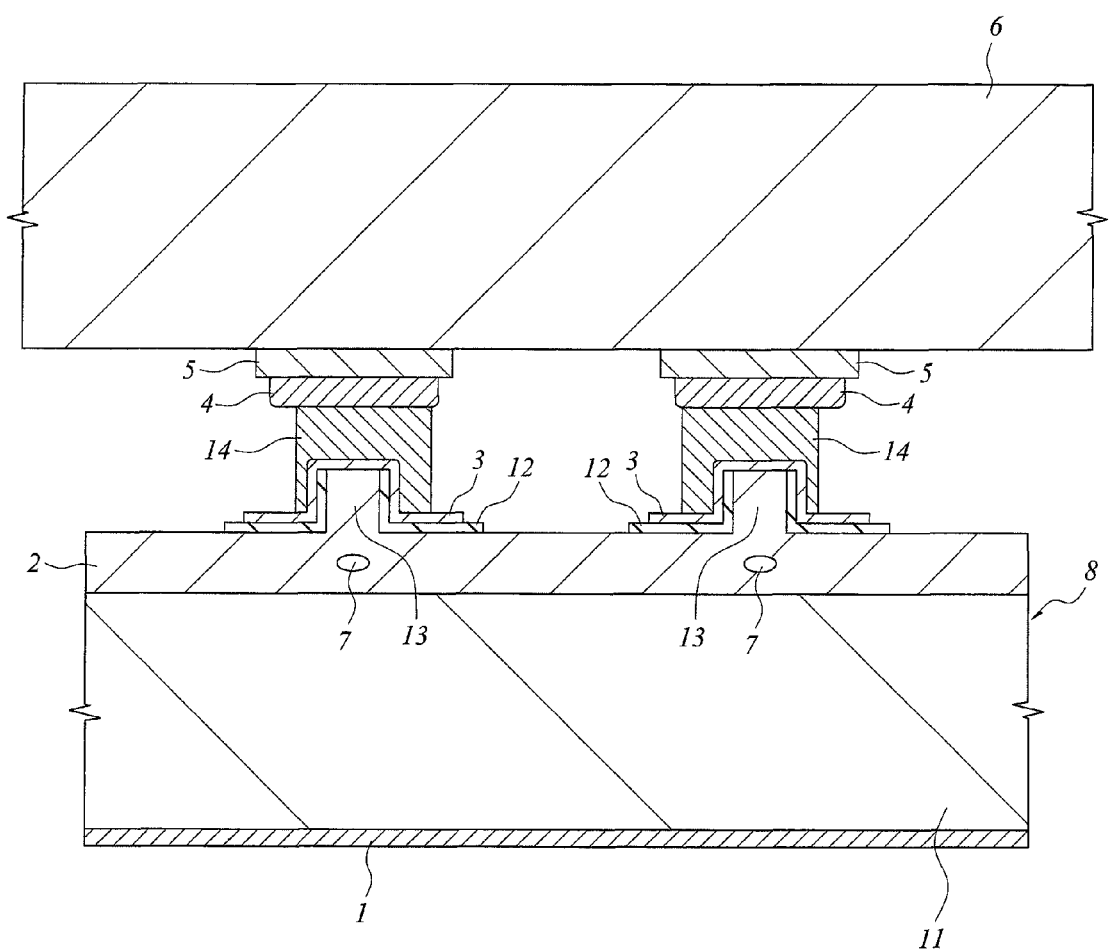
FIG. 5 is a partial cross-sectional view showing the multi-beam semiconductor laser device according to an embodiment of the present invention.

As shown in FIG. 5, the semiconductor laser element array (laser chip) 8 has a structure in which the semiconductor layer 2 having two convex ridge portions 13 is stacked on the substrate 11 on which the n type electrode (cathode electrode) 1 as a common electrode is formed, and the light-emitting portions 7 in the semiconductor layer 2 are arranged one-dimensionally at regular intervals. The two ridge portions 13 are arranged so as to be symmetrical to the central position of the substrate 11. These ridge portions 13 extend in the resonator direction of the semiconductor laser element array 8 and serve as power feeding portions where the current is narrowed and supplied.

An insulating layer 12 is formed on both side surfaces of the ridge portion 13 and on the semiconductor layer 2 in proximity to the ridge portion 13, and the p type electrode (anode electrode) 3 as an independent electrode is formed on the insulating layer 12 so as to be in contact with the upper surface of the ridge portion 13. Further, an Au plating layer (metal layer) 14 for heat dissipation is formed on the surface of the p type electrode 3.

Two submount electrodes 5 are formed on a lower surface of the submount 6 so as to be opposed to the p type electrodes 3, and the submount electrode 5 and the Au plating layer 14 are bonded to each other with the solder 4 made of Au—Sn alloy or others. Although the illustration thereof is omitted here, the heat sink made of Cu is bonded with solder to the upper surface of the submount 6.

As shown in the figure, the Au plating layer 14 is formed so as to be asymmetrical with respect to the central position of the ridge portion 13 in each of the ridge portions 13. In other words, the central position of the Au plating layer 14 is intentionally displaced with respect to the central position of the underlying light-emitting portion 7. Therefore, at the stage before the semiconductor laser element array 8 is mounted on the submount 6, the shear strain in a plus direction is applied to the light-emitting portion 7 located on the left side with respect to the central position of the substrate 11, and the shear strain in a minus direction is applied to the light-emitting portion 7 located on the right side.

In consideration of the heat dissipation of the Au plating layer 14, the width of the Au plating layer 14 has to be at least four times as large as the width of the light-emitting portion 7 (Wb) or more. Therefore, assuming that the actual width of the Au plating layer 14 is Wa, the upper limit of the displacement between the central position of the Au plating layer 14 and the central position of the light-emitting portion 7 is (Wa−4Wb)/2. More specifically, assuming that the beam pitch (pitch of adjacent light-emitting portions 7) is 100 μm, the width of the Au plating layer 14 (Wa) is 50 μm, and the width of the light-emitting portion 7 (Wb) is 2 μm, the upper limit of the displacement between the central position of the Au plating layer 14 and the central position of the light-emitting portion 7 is (50 μm−8 μm)/2=21 μm. On the other hand, assuming that the positional accuracy (A) of the Au plating layer 14 is ±2 μm, the lower limit of the displacement is 1.5 A=about 3 μm.

Next, the semiconductor layer 2 will be described in detail with reference to FIG. 6. FIG. 6 is an enlarged cross-sectional view showing a region corresponding to one element of the semiconductor laser element array 8.

The semiconductor laser element 21 includes the substrate (n-GaAs substrate) 11 having a first surface and a second surface opposite to the first surface and made of GaAs of a first conductivity type (for example, n type), and the semiconductor layer 2 is formed on the first surface. The semiconductor layer 2 includes an n type clad layer 15, an active layer 16 having a multi-quantum well structure, a p type first clad layer 17, a p type etching stop layer 18, a p type second clad layer 19 and a p type contact layer 20 sequentially stacked in the direction vertical to the first surface.

Next, examples of the material and the thickness of the semiconductor layer 2 will be described. The n type clad layer 15 is made of AlGaInP with a thickness of 2.0 μm. The active layer 16 has the three-layer multi-quantum well structure including barrier layers made of AlGaInP with a thickness of 5 nm and a well layer made of GaInP with a thickness of 6 nm. The p type first clad layer 17, the p type etching stop layer 18 and the p type second clad layer 19 are all made of AlGaInP. The thickness of the p type first clad layer 17 is 0.3 μm, the thickness of the p type etching stop layer 18 is 20 nm, and the thickness of the p type second clad layer 19 is 1.2 μm. Also, the p type contact layer 20 is made of GaAs with a thickness of 0.4 μm.

Furthermore, some components of the semiconductor layer 2 are referred to as follows so as to clarify the conductivity type and the material thereof. That is, the n type clad layer 15 is referred to as an n-AlGaInP clad layer, the p type first clad layer 17 is referred to as a p-AlGaInP first clad layer, the p type second clad layer 19 is referred to as a p-AlGaInP first clad layer, and the p type contact layer 20 is referred to as a p-GaAs contact layer.

The insulating layer 12 is formed on a first surface side of the n-GaAs substrate 11 except the surface (upper surface) of the ridge portion 13. The insulating layer 12 is constituted of, for example, a silicon oxide film and a PSG film formed on this silicon oxide film. Also, the insulating layer 12 covers a part of the upper surface of the n-GaAs substrate 11 including the respective side surfaces (both side surfaces) of the ridge portion 13 as shown in FIG. 6. Alternatively, the insulating layer 12 may cover the entire upper surface of the n-GaAs substrate 11 except the surface (upper surface) of the ridge portion 13.

The p type electrode 3 is formed on the ridge portion 13 and on the insulating layer 12. A part of the p type electrode 3 is connected to the p-GaAs contact layer 20 of the ridge portion 13. Also, as shown in FIG. 6, end portions of the p type electrode 3 terminate on the insulating layer 12 so as not to reach both edge portions of the n-GaAs substrate 11. In other words, the p type electrode 3 is an independent electrode separated on the insulating layer 12, and voltage can be individually applied to the ridge portion 13 of each of the semiconductor laser elements 21. The p type electrode 3 is formed from a multilayered metal film obtained by sequentially stacking Ti, Pt and Au, and the total thickness thereof is 0.5 μm.

The Au plating layer 14 having thermal conductivity higher than that of the n-GaAs substrate 11 is formed on the p type electrode 3. The Au plating layer 14 is formed to have a large thickness of 3 μm to 7 μm, and the surface (upper surface) thereof is planarized. On the other hand, the n type electrode 1 is formed on the second surface of the n-GaAs substrate 11. The n type electrode 1 is formed from a multilayered metal film obtained by sequentially stacking Ti, Pt and Au, and the total thickness thereof is 0.5 μm.

In the semiconductor laser element 21 shown in FIG. 5 and FIG. 6, the p-AlGaInP first clad layer 19 and the p-GaAs contact layer 20 are not present on the p type etching stop layer 18 in the region outside the ridge portion 13. However, it does not matter if the p-AlGaInP first clad layer 19 and the p-GaAs contact layer 20 are present on the p type etching stop layer 18 in the region outside the ridge portion 13 as shown in FIG. 7.

Figure 8:
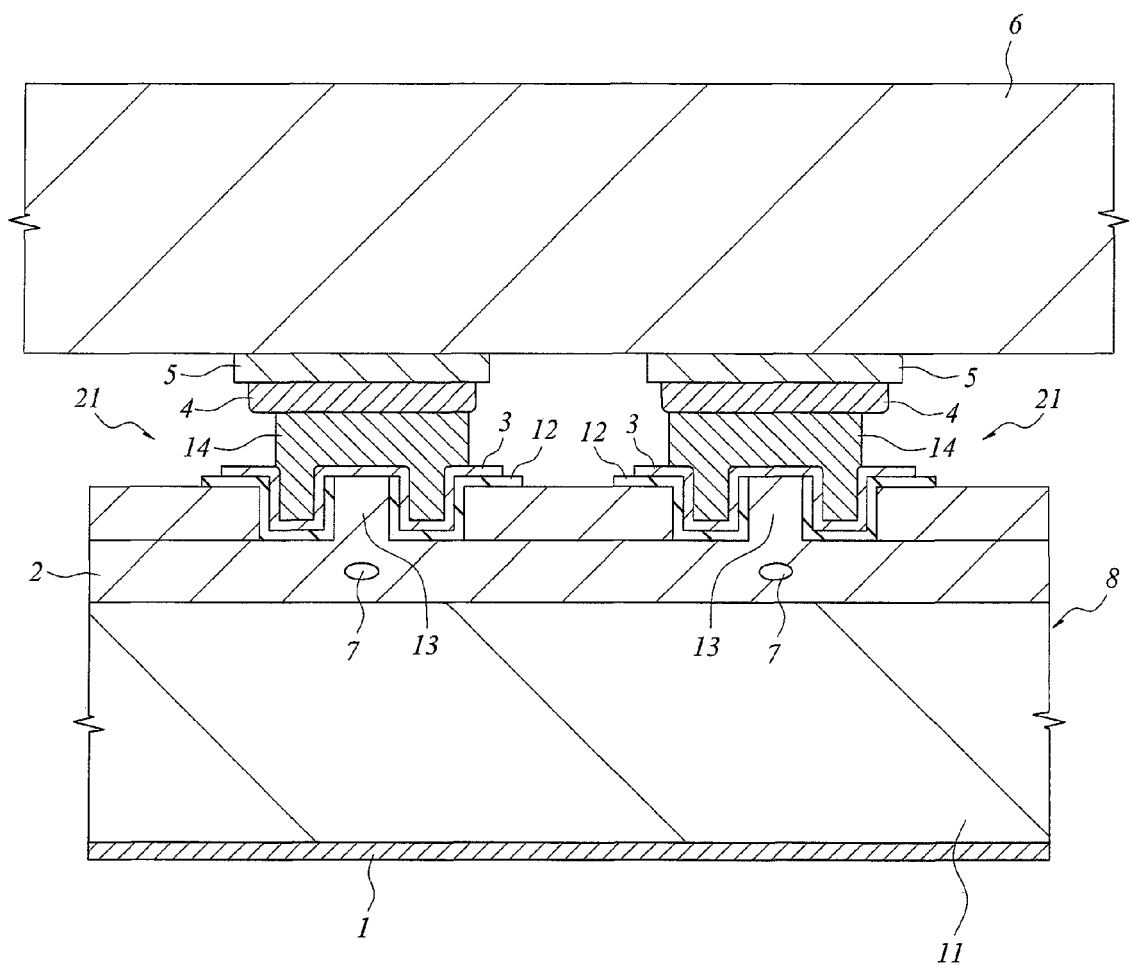
FIG. 8 is a partial cross-sectional view showing the multi-beam semiconductor laser device having the chip structure shown in FIG. 7.
Figure 9:
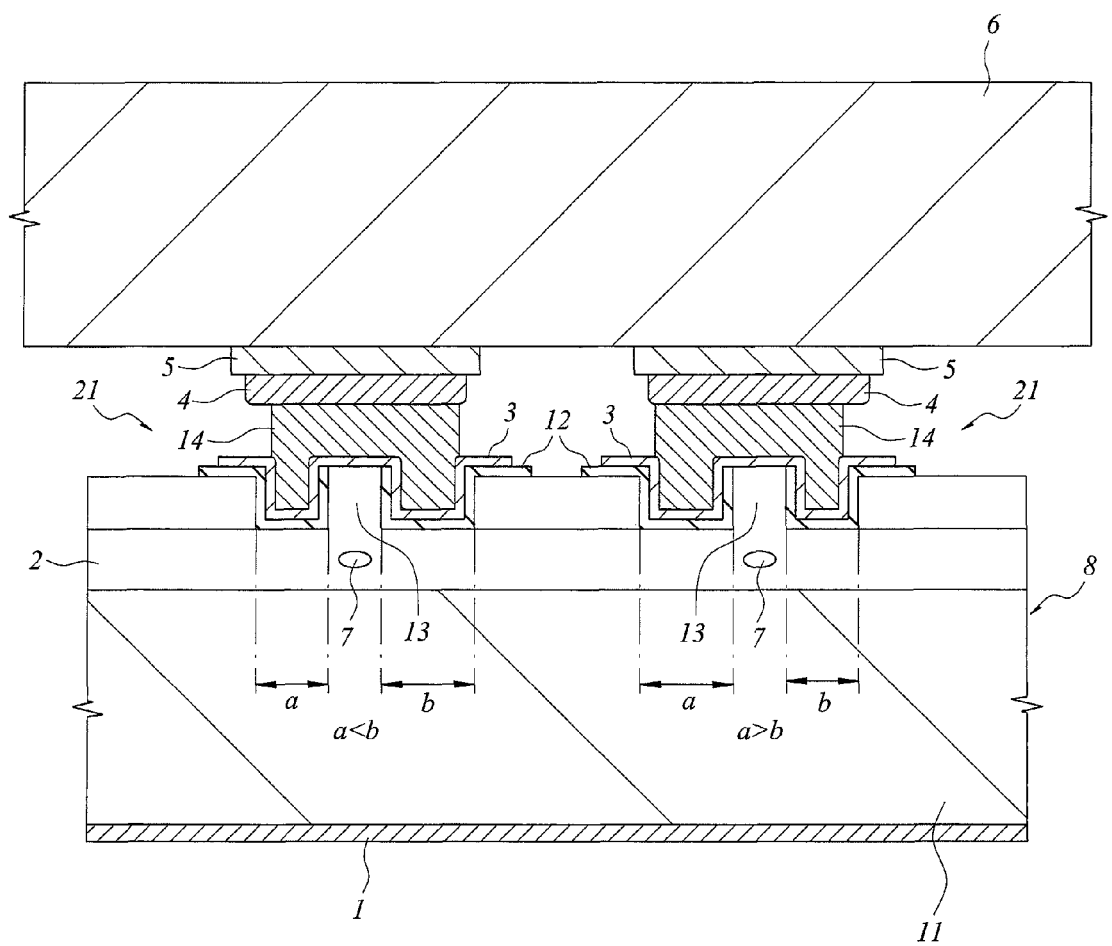
FIG. 9 is a partial cross-sectional view showing another example of the chip structure of the multi-beam semiconductor laser device according to the present invention.

Further, when the present invention is applied to the semiconductor laser element 21 shown in FIG. 7, the structure of the semiconductor laser element array 8 is as shown in FIG. 8. Note that, in the case of the semiconductor laser element 21 shown in FIG. 7, when the widths of the concave portions provided on both sides of the ridge portion 13 are a and b, respectively, the widths of the concave portions may be asymmetrical so that a is shorter than b in the semiconductor laser element 21 on the left side with respect to the central position of the substrate 11 and a is longer than b in the semiconductor laser element 21 on the right side. Also in the structure shown in FIG. 9, the shear strain in the direction opposite to that of the shear strain applied by the mounting can be applied to the light-emitting portions 7 like in the structures shown in FIG. 5 and FIG. 8.

Figure 10:
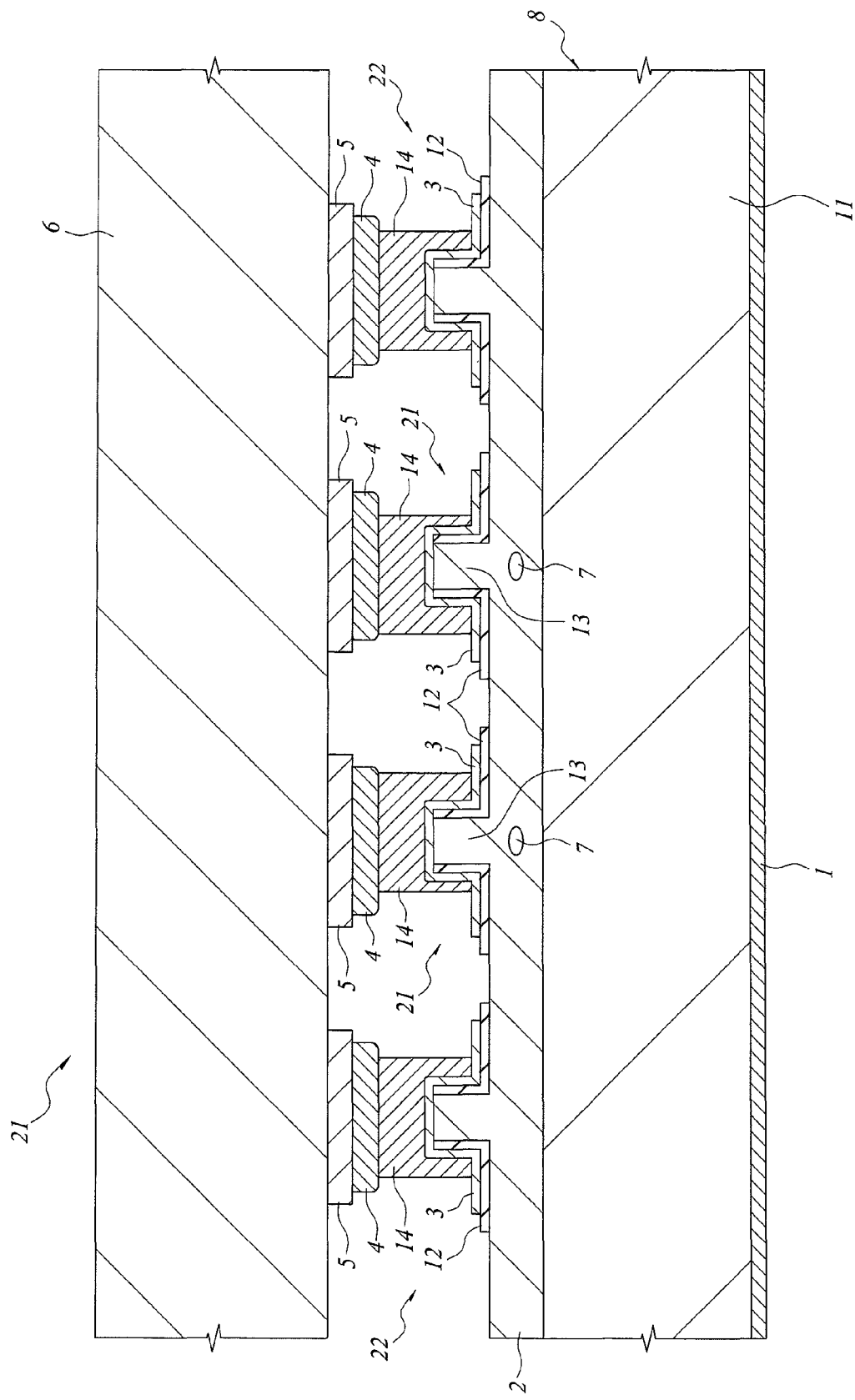
FIG. 10 is a partial cross-sectional view showing the multi-beam semiconductor laser device according to another embodiment of the present invention.

Also, it is also possible to provide pseudo laser elements 22 which do not emit light at the time of use in a region adjacent to the semiconductor laser element 21 as shown in FIG. 10. In the structure where the pseudo laser elements 22 as described above are provided, not only the shear strain applied by the mounting but also the relative difference in direct strain can be further reduced. Therefore, the relative difference in properties between the semiconductor laser elements 21 can be reduced. Note that the Au plating layer 14 of the pseudo laser element 22 is not required to be asymmetrical with respect to the center of the pseudo laser element 22.

Figure 11:
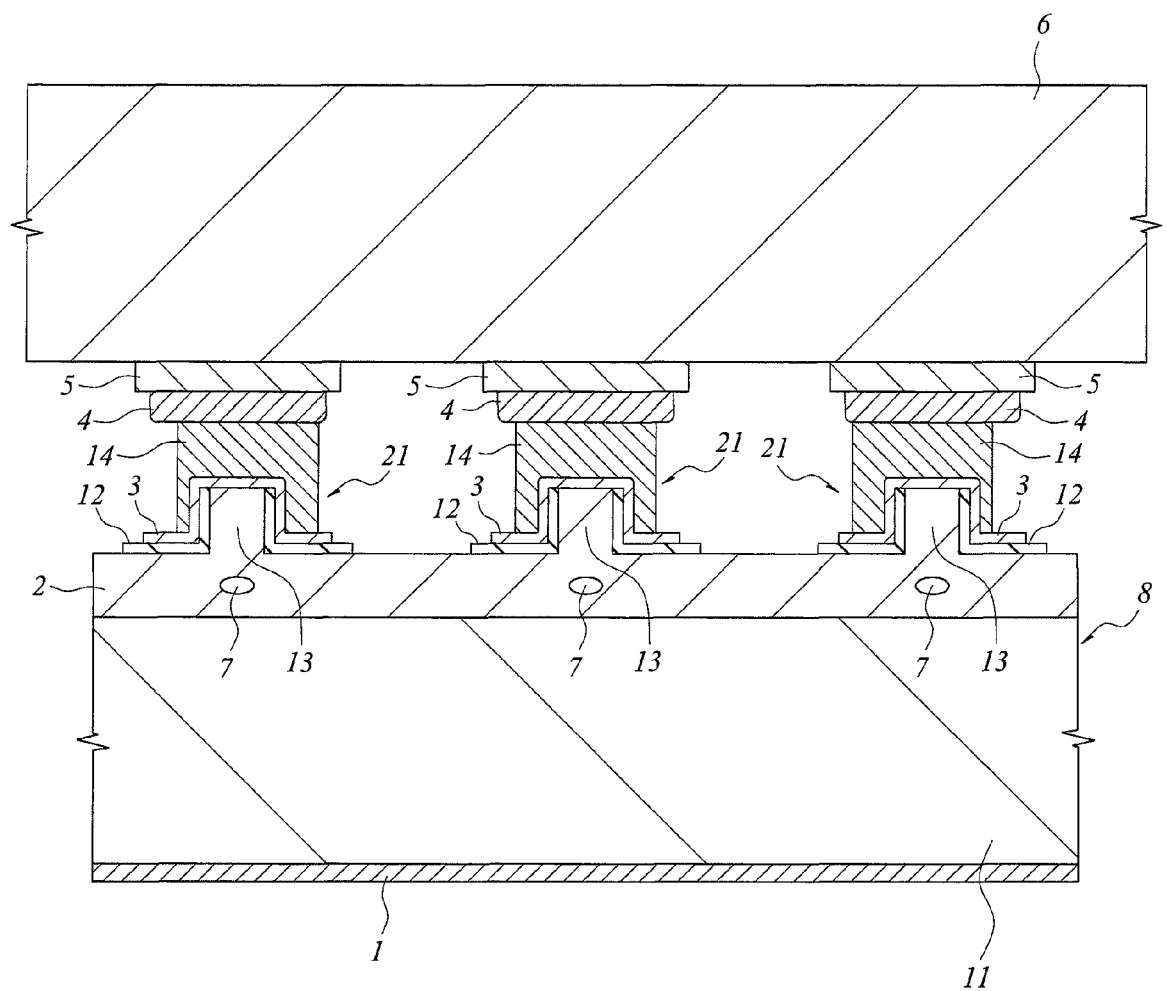
FIG. 11 is a partial cross-sectional view showing the multi-beam semiconductor laser device according to another embodiment of the present invention.
Figure 12:
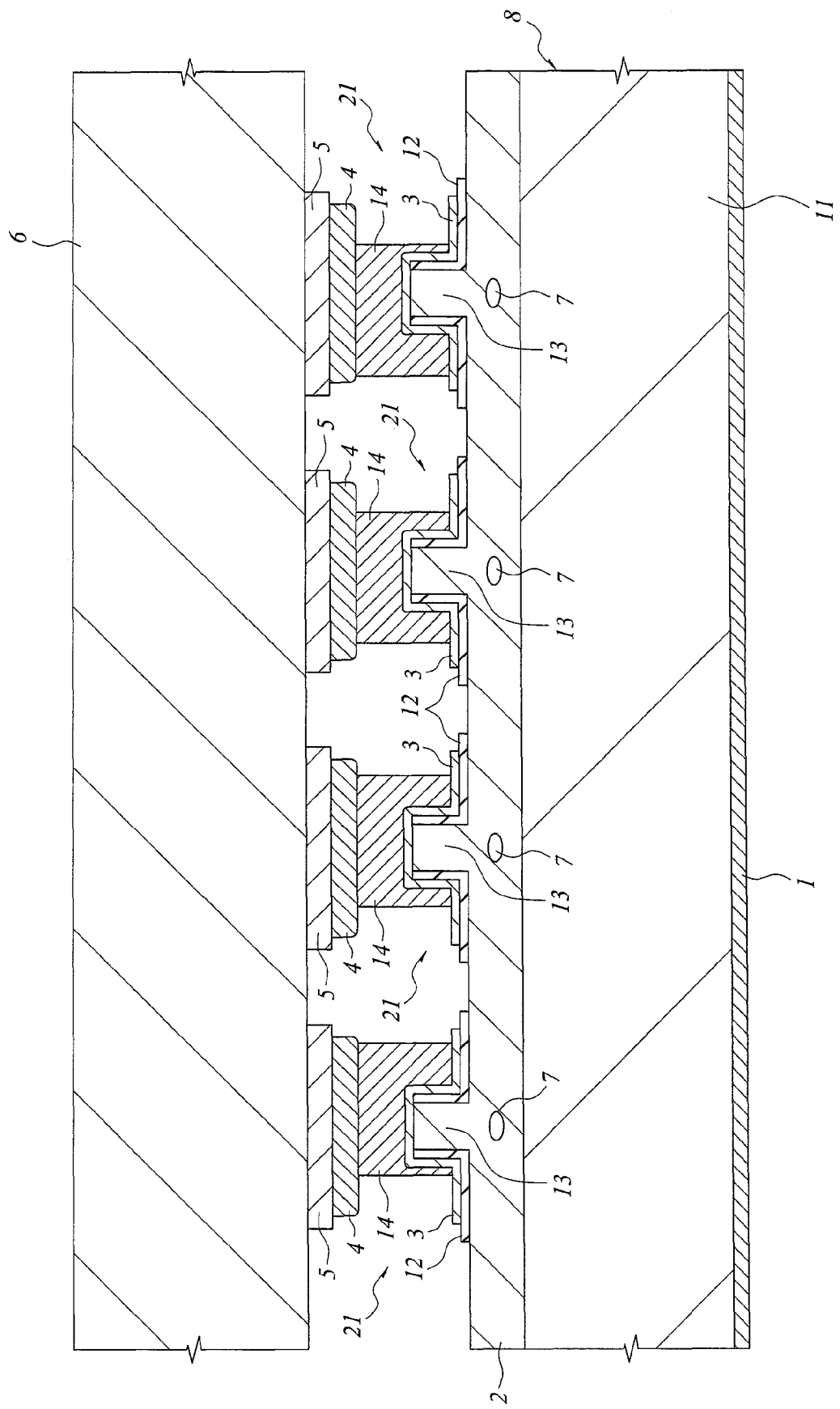
FIG. 12 is a cross-sectional view of the principal part showing the multi-beam semiconductor laser device according to another embodiment of the present invention.

Further, when the number of beams is odd (for example, three) as shown in FIG. 11, the Au plating layer 14 of the semiconductor laser element 21 located at the center of the substrate 11 is formed so as to be symmetrical with respect to the center of the underlying light-emitting portion 7. Further, in the case of the multi-beam semiconductor laser device with four or more beams, the central position of the Au plating layer 14 is largely displaced with respect to the central position of the light-emitting portion 7 in the semiconductor laser element 21 farther from the center of the substrate 11 as shown in FIG. 12. In other words, with the structure as shown in FIG. 12, the shear strain larger than that of the inner semiconductor laser elements 21 is applied to the outer semiconductor laser elements 21 in advance of the mounting.

Figure 3:
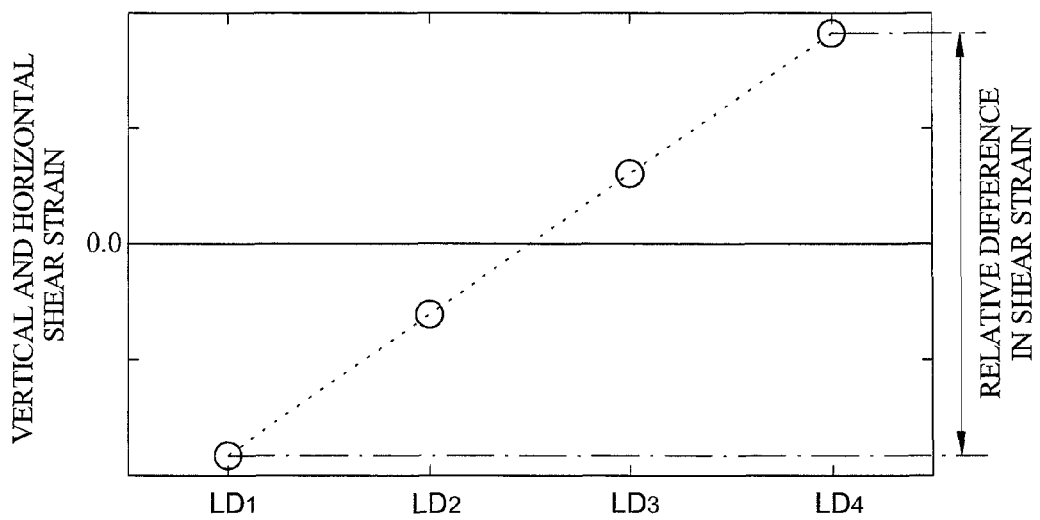
FIG. 3 is a graph showing plotted shear strains of the light-emitting portions in FIG. 2.
Figure 4:
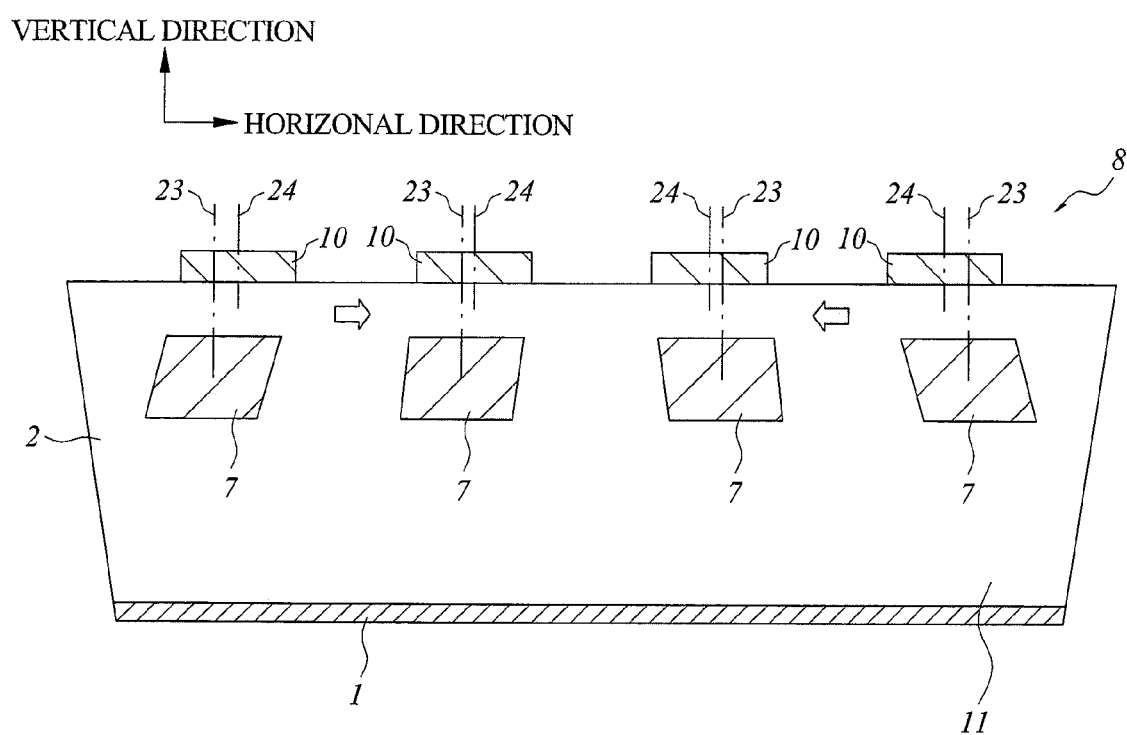
FIG. 4 is a schematic diagram showing the shear deformation of the light-emitting portions in a laser chip before mounting.

As described above, when the linear expansion coefficient of the substrate 11 is larger than that of the submount 6, the minus shear strain is applied to the light-emitting portions 7 on the left side with respect to the central position of the substrate 11 and the plus shear strain is applied to the light-emitting portions 7 on the right side by the mounting as shown in FIG. 3. However, since the shear strain in opposite direction is applied in advance to the semiconductor laser elements 21 before mounting in the structure of the present embodiment, the shear strain applied after the mounting is cancelled, and as a result, the shear strain after the mounting is reduced in comparison to that of the conventional structure. Accordingly, the relative difference in polarization angle due to the relative difference in shear strain can be reduced.

Figure 1:
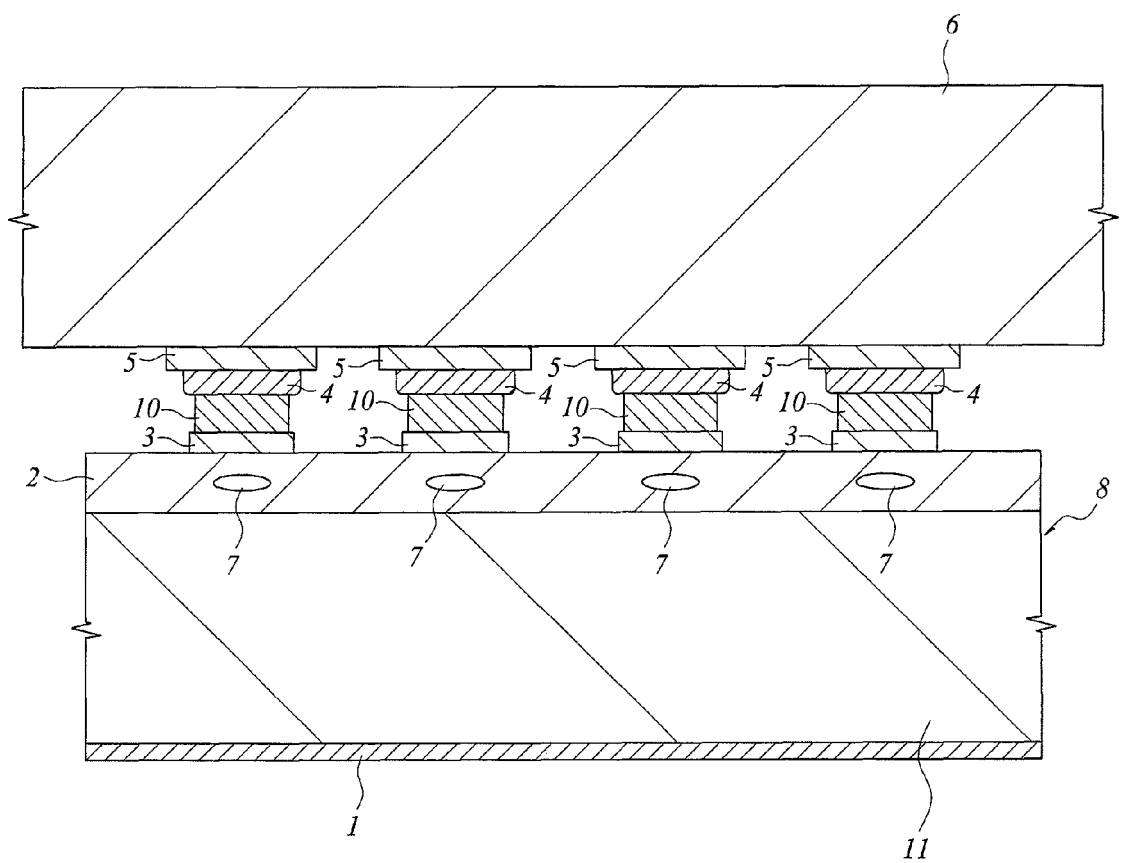
FIG. 1 is a cross-sectional view of the principal part showing the general structure of a multi-beam semiconductor laser device.
Figure 2:
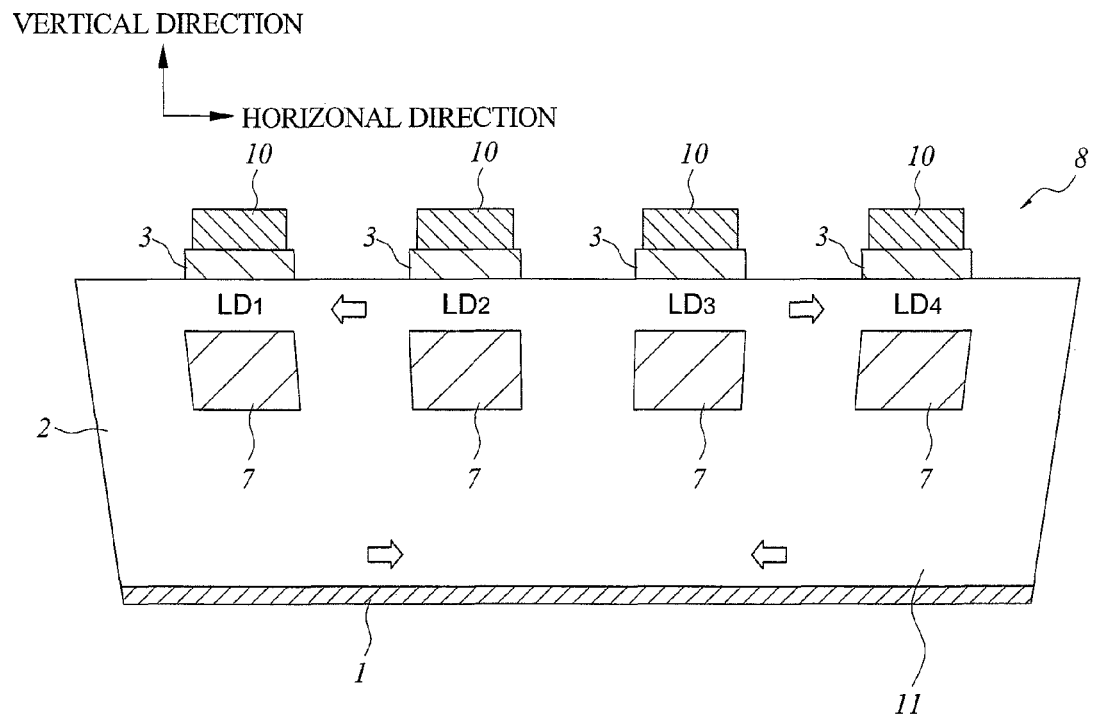
FIG. 2 is a schematic diagram showing the shear deformation of the light-emitting portions in a laser chip after mounting.
Figure 13:
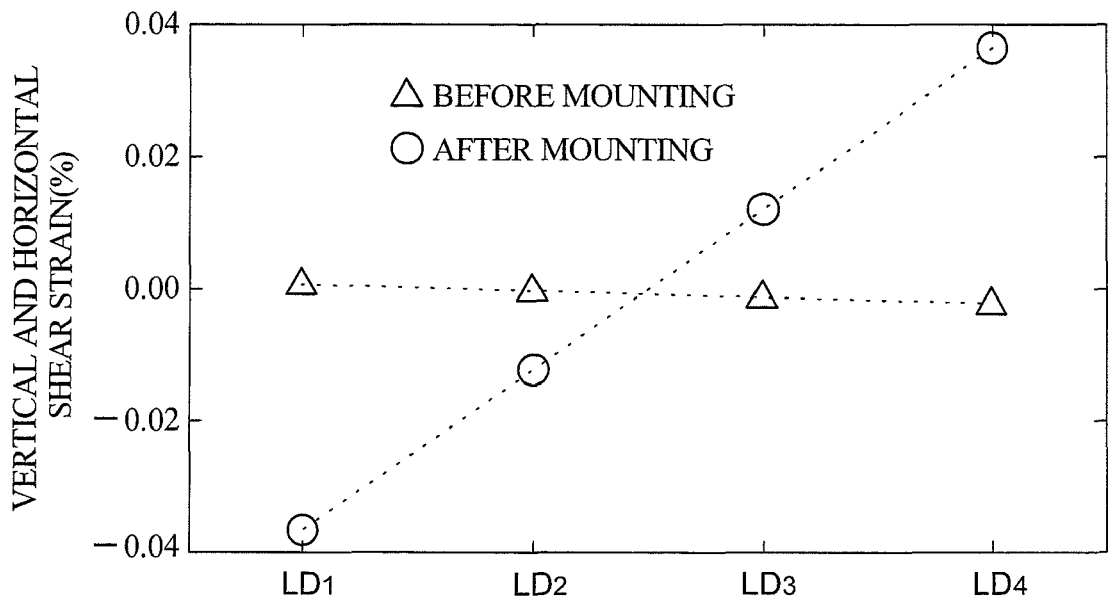
FIG. 13 is a graph of the shear strain distribution in the multi-beam semiconductor laser device shown in FIG. 1.
Figure 14:
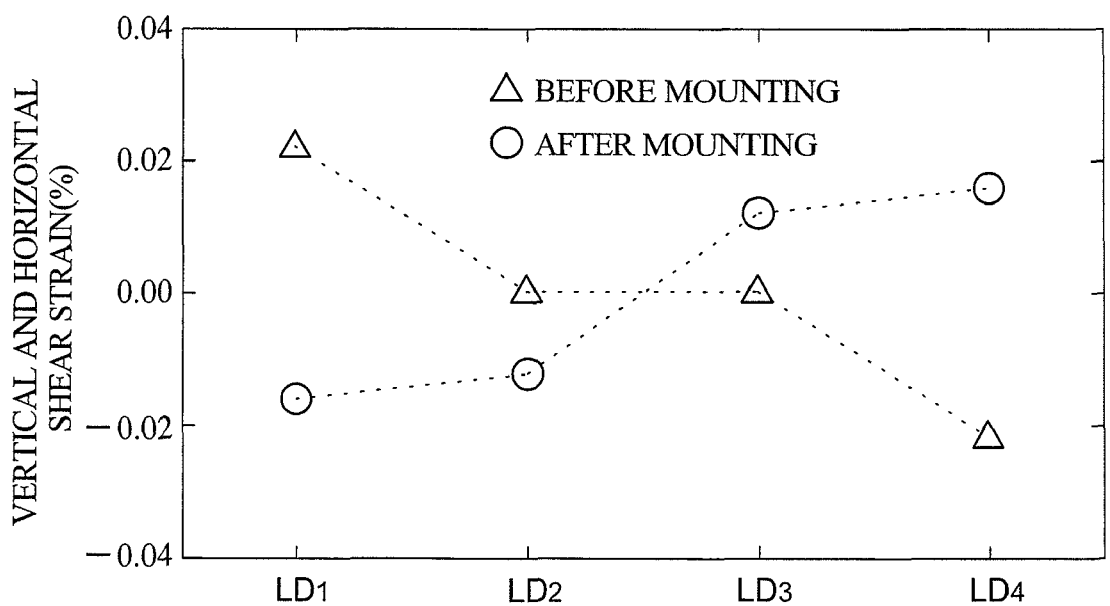
FIG. 14 is a graph of the shear strain distribution in the multi-beam semiconductor laser device according to the present invention shown in FIG. 12.

FIG. 13 and FIG. 14 are characteristic diagrams (graphs) showing the effect of the present embodiment. These graphs are obtained by the stress analysis using the finite element method to the multi-beam semiconductor laser device with four beams. In FIG. 13 and FIG. 14, a triangular mark denotes the shear strain before the mounting in each of the light-emitting portions 7, and a circular mark denotes the shear strain after the mounting in each of the light-emitting portions 7. FIG. 13 shows the shear strain distribution in the conventional structure, and it can be understood from FIG. 13 that there is no relative difference in shear strain before the mounting and the relative difference in shear strain is caused after the mounting in the conventional structure. FIG. 14 shows the shear strain distribution in the structure of the present embodiment. In FIG. 14, based on the results of FIG. 13, the structure of the present embodiment is applied to the outer semiconductor laser elements (corresponding to LD1 and LD4 in FIG. 2 and FIG. 13) where the shear strain is particularly large. It can be understood that the relative difference in shear strain after the mounting is reduced in the structure of the present embodiment in comparison to that of the conventional structure because the shear strain is applied to the light-emitting portions 7 of LD1 and LD4 at the stage before the mounting.

Second Embodiment

Figure 15:
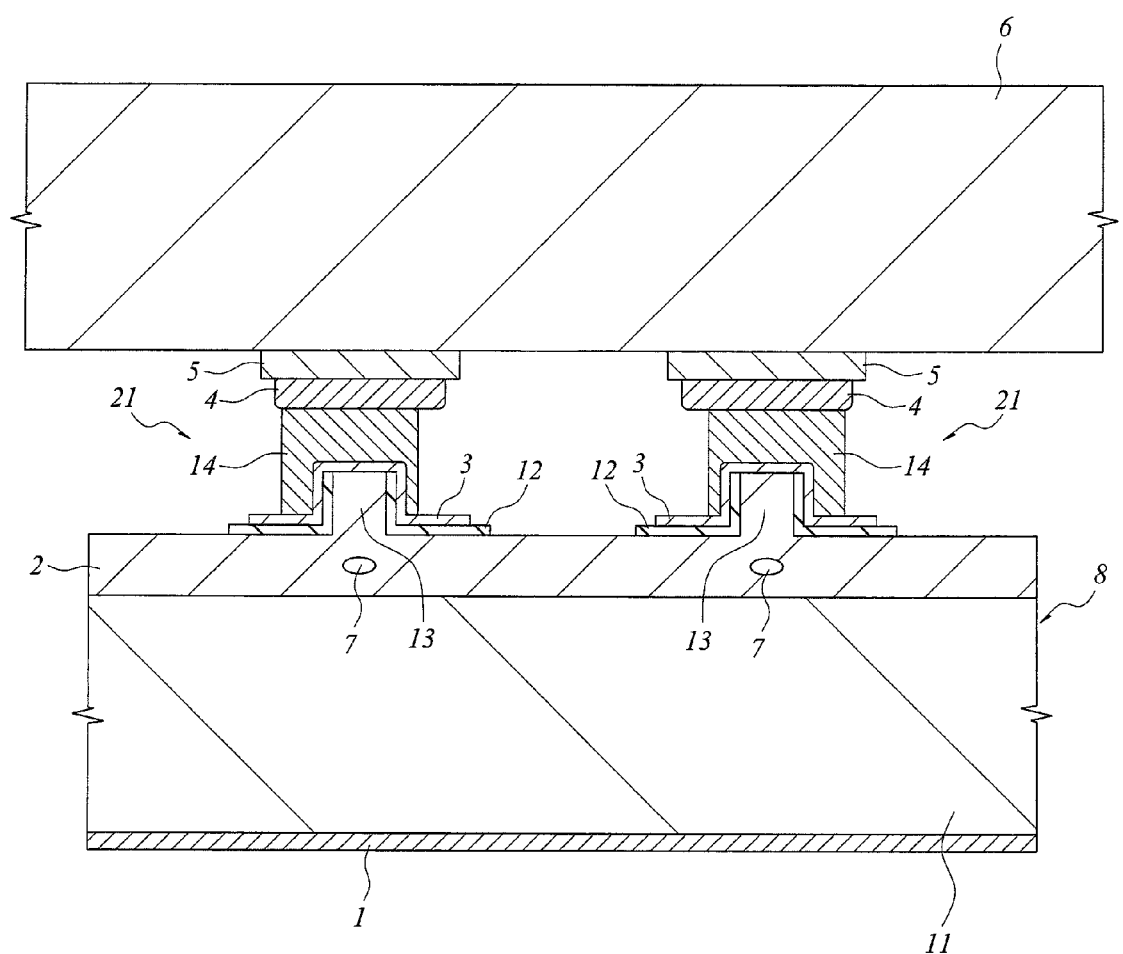
FIG. 15 is a cross-sectional view of the principal part showing the multi-beam semiconductor laser device according to another embodiment of the present invention.

In this embodiment, an example where the present invention is applied to the semiconductor laser device in which the linear expansion coefficient of the substrate 11 is smaller than that of the submount 6 will be described with reference to FIG. 15. In FIG. 15, the structure of the multi-beam semiconductor laser device is described, and the structure other than that is the same as that of the first embodiment. Also, the upper limit and the lower limit of the displacement between the central position of the Au plating layer 14 and the central position of the light-emitting portion 7 are the same as those of the first embodiment.

In the multi-beam semiconductor laser device according to the present embodiment, for example, GaAs (linear expansion coefficient=6.4×10$^{-6}$/K) is selected as a material of the substrate 11 and CuW (linear expansion coefficient=6.5×10$^{-6}$/K to 8.3×10$^{-6}$/K) is selected as the submount 6. In this case, the plus shear strain is applied to the light-emitting portion of the semiconductor laser element 21 on the left side with respect to the central position of the substrate 11 and the minus shear strain is applied to the light-emitting portion on the right side after the mounting.

Therefore, the Au plating layers 14 are formed so that the centers of the Au plating layers 14 are located outwardly with respect to the centers of the respective underlying light-emitting portions 7 as shown in FIG. 15. By this means, the minus shear strain is applied to the light-emitting portion 7 of the semiconductor laser element 21 on the left side with respect to the central position of the substrate 11 and the plus shear strain is applied to the light-emitting portion 7 of the semiconductor laser element 21 on the right side before the mounting.

Third Embodiment

In this embodiment, an example where the present invention is applied to the multi-beam semiconductor laser device having convex ridge portions will be described.

Figure 16:
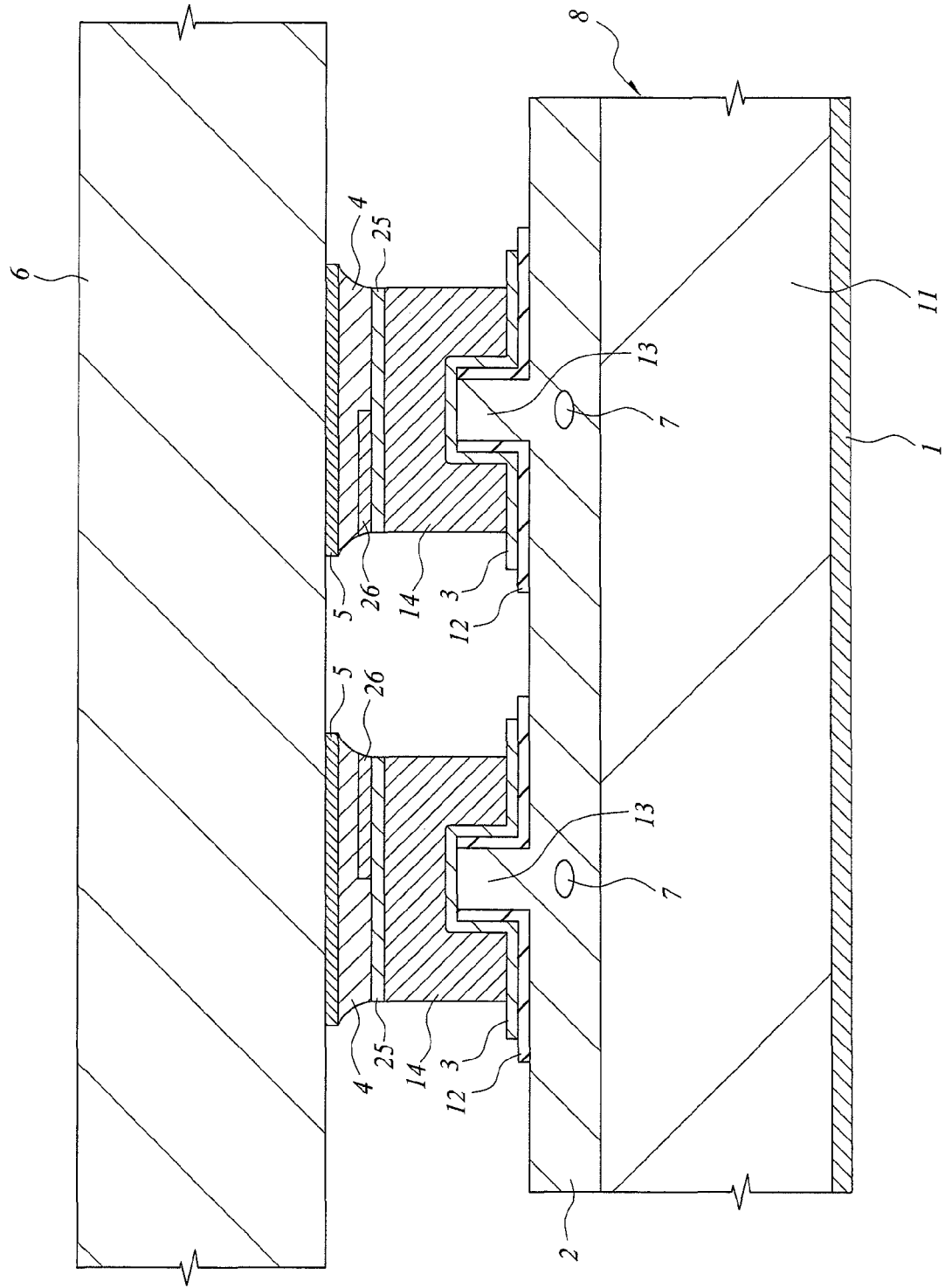
FIG. 16 is a cross-sectional view of the principal part showing the multi-beam semiconductor laser device according to another embodiment of the present invention.

FIG. 16 is a cross-sectional view of the principal part showing the multi-beam semiconductor laser device according to the present embodiment. As shown in FIG. 16, in the laser chip 8 of the semiconductor laser device, the semiconductor layer 2 having a plurality of (two in the present embodiment) convex ridge portions 13 is stacked on a main surface of the substrate 11 made of GaAs (linear expansion coefficient=6.4×10$^{-6}$/K), and the light-emitting portions 7 are formed in the semiconductor layer 2 below the two ridge portions 13. The two ridge portions 13 extend in the resonator direction of the laser chip 8 and serve as power feeding portions where the current is narrowed and supplied.

The insulating layer 12 is formed on both side surfaces of the ridge portion 13 and on the semiconductor layer 2 in proximity to the ridge portion 13, and the p type electrode (anode electrode) 3 as an independent electrode is formed on the insulating layer 12 so as to be in contact with the upper surface of the ridge portion 13. Further, the Au plating layer 14 for heat dissipation is formed on the surface of the p type electrode 3. On the other hand, the n type electrode (cathode electrode) 1 as a common electrode is formed on the rear surface of the substrate 11. The n type electrode 1 is formed from a metal film obtained by sequentially stacking a Ti layer and a Pt layer and an Au layer on the Ti layer.

The laser chip 8 described above is mounted with the solder 4 on the lower surface of the submount (support substrate 6) made of SiC (linear expansion coefficient=4.0×10$^{-6}$/K) or AlN (linear expansion coefficient=4.8×10$^{-6}$/K). The solder 4 is made of, for example, Au—Sn alloy. Note that, although the illustration thereof is omitted here, the heat sink made of Cu is connected with solder to the upper surface of the submount 6.

In the semiconductor laser device according to the present embodiment, the connecting portion of the laser chip 8 and the submount 6 has the structure as follows. That is, a barrier metal layer 25 made of a material having no wettability to the solder 4 is formed on the surface of the Au plating layer 14 of the laser chip 8, and a metal layer 26 made of a material having wettability to the solder 4 is stacked on a part of the surface of the barrier metal layer 25. The barrier metal layer 25 having no wettability to the solder 4 is formed from, for example, a Ti layer and a Pt layer stacked on the Ti layer. Also, the metal layer 26 having wettability to the solder 4 is made of Au.

Therefore, a part of the solder 4 interposed between the laser chip 8 and the submount 6 is in contact with the barrier metal layer 25, and the other part thereof is in contact with the metal layer 26. Note that, since the barrier metal layer 25 does not have the wettability to the solder 4, the barrier metal layer 25 and the solder 4 are not bonded to each other though they are in contact with each other. Contrary to this, since the metal layer 26 (=Au) has the wettability to the solder 4 (=Au—Sn), the metal layer 26 and the solder 4 are bonded to each other by the Au—Sn alloy bonding in the region where the metal layer 26 and the solder 4 are in contact with each other. Further, although the metal layer 26 and the solder 4 are shown in FIG. 16 as if they are separated from each other, the boundary therebetween is not clear because the metal layer 26 is melted in the solder 4 in practice.

On the other hand, on the lower surface of the submount 6, two submount electrodes 5 are formed so as to be opposed to the two ridge portions 13 of the laser chip 8, and the submount electrodes 5 are in contact with the solders 4. The submount electrode 5 is formed from, for example, a Ti layer, a Pt layer stacked on the Ti layer and an Au layer stacked on the Pt layer. More specifically, since the surface of the submount electrode 5 is made of a material (=Au) having wettability to the solder 4 (=Au—Sn), the submount electrode 5 and the solder 4 are bonded to each other by the Au—Sn alloy bonding.

Thus, in the region where the laser chip 8 and the solder 4 are in contact with each other, only the contact surfaces of the metal layer 26 and the solder 4 are bonded to each other, and the contact surfaces of the barrier metal layer 25 and the solder 4 are not bonded to each other though heat and electricity are transmitted.

As described above, in the case where the laser chip 8 is mounted on the submount 6 via the solder 4, one factor of the variation in beam polarization angle of the light-emitting portions 7 is the nonuniformity of the wettability of the solder 4 at the interface between the Au plating layer 14 and the solder 4 formed in each of the light-emitting portions 7.

Therefore, in the present embodiment, in consideration of the direction and the magnitude of the shear strain in each of the light-emitting portions 7 shown in FIG. 13, the ratio of "contact area between the metal layer 26 and the solder 4 contact area between the barrier metal layer 25 and the solder 4" is controlled for each of the light-emitting portions 7. By this means, the beam position dependency of the polarization angle is cancelled, and therefore, the multi-beam semiconductor laser device in which the difference in polarization angle between beams is reduced can be realized.

Figure 17:
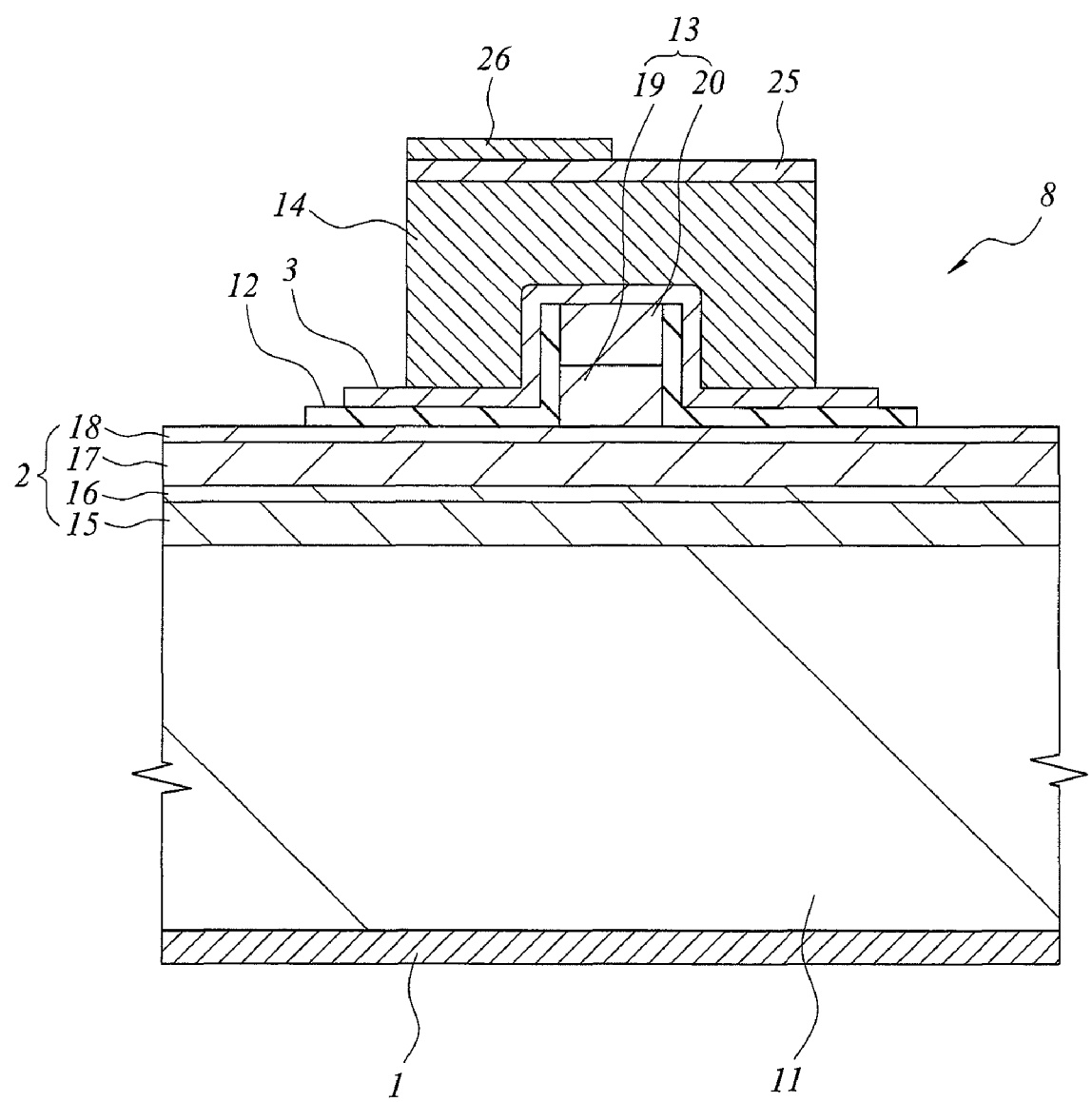
FIG. 17 is a partially enlarged cross-sectional view showing the semiconductor chip mounted on the multi-beam semiconductor laser device shown in FIG. 16.

Next, the structure of the semiconductor layer 2 of the laser chip 8 will be described in detail with reference to FIG. 17. FIG. 17 is an enlarged cross-sectional view showing a region corresponding to one element of the laser chip 8.

The laser chip 8 includes the substrate 11 made of, for example, n-type GaAs and the semiconductor layer 2 is formed on a main surface thereof. The semiconductor layer 2 includes the n type clad layer 15, the active layer 16 having a multi-quantum well structure, the p type first clad layer 17 and the p type etching stop layer 18 sequentially stacked in the direction vertical to the main surface. Also, the ridge portion 13 on the semiconductor layer 2 is constituted of the p type second clad layer 19 and the p type contact layer 20.

Next, examples of the material and the thickness of the semiconductor layer 2 will be described. The n type clad layer 15 is made of AlGaInP with a thickness of 2.0 μm. The active layer 16 has the three-layer multi-quantum well structure including barrier layers made of AlGaInP with a thickness of 5 nm and a well layer made of GaInP with a thickness of 6 nm. The p type first clad layer 17, the p type etching stop layer 18 and the p type second clad layer 19 are all made of AlGaInP. The thickness of the p type first clad layer 17 is 0.3 μm, the thickness of the p type etching stop layer 18 is 20 nm, and the thickness of the p type second clad layer 19 is 1.2 μm. Also, the p type contact layer 20 is made of GaAs with a thickness of 0.4 μm.

The insulating layer 12 is formed on a main surface side of the substrate 11 except the surface (upper surface) of the ridge portion 13. The insulating layer 12 is constituted of, for example, a silicon oxide film and a PSG film formed on this silicon oxide film. The insulating layer 12 covers a part of the upper surface of the substrate 11 including the respective side surfaces (both side surfaces) of the ridge portion 13. Alternatively, the insulating layer 12 may cover the entire upper surface of the substrate 11 except the surface (upper surface) of the ridge portion 13.

The p type electrode 3 is formed on the ridge portion 13 and on the insulating layer 12. A part of the p type electrode 3 is connected to the p type contact layer 20 of the ridge portion 13. Also, end portions of the p type electrode 3 terminate on the insulating layer 12 so as not to reach both edge portions of the substrate 11. In other words, the p type electrode 3 is an independent electrode separated on the insulating layer 12, and voltage can be individually applied to the ridge portions 13 of each of the semiconductor laser elements. The p type electrode 3 is formed from a metal film obtained by sequentially stacking a Ti layer and a Pt layer and an Au layer on this Ti layer, and the total thickness thereof is 0.5 μm.

The Au plating layer 14 having thermal conductivity higher than that of the substrate 11 is formed on the p type electrode 3. The Au plating layer 14 is formed to have a large thickness of 3 μm to 7 μm. On the other hand, the n type electrode 1 is formed on a rear surface of the substrate 11. The n type electrode 1 is formed from a multilayered metal film obtained by sequentially stacking Ti, Pt and Au, and the total thickness thereof is 0.5 μm.

Next, the method of mounting the laser chip 8 on the submount 6 will be described with reference to FIG. 18 to FIG. 23. FIG. 18 to FIG. 23 are cross-sectional views showing a region corresponding to one laser element of the substrate 11 in a wafer state.

Figure 18:
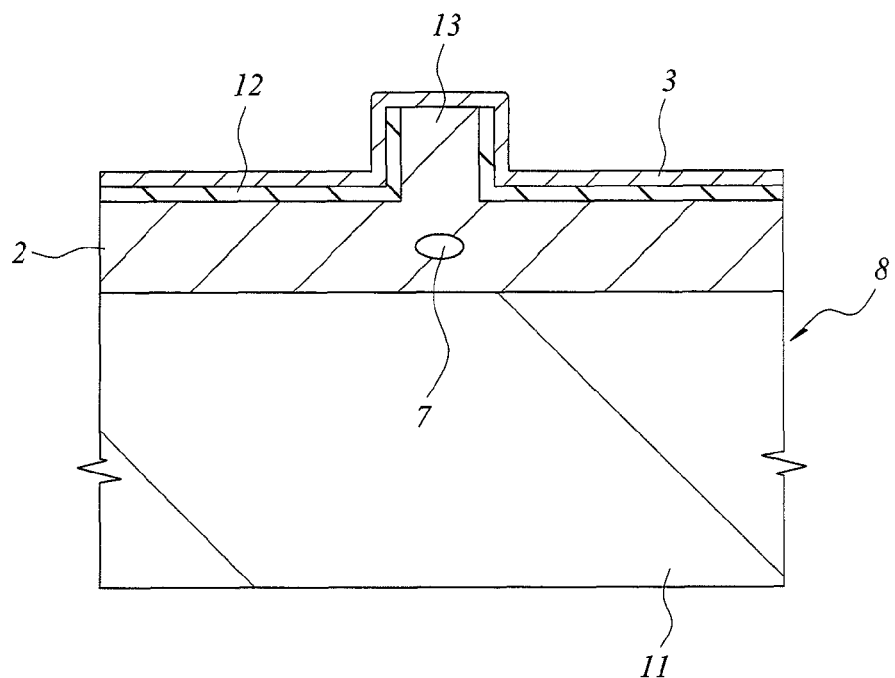
FIG. 18 is a cross-sectional view of the principal part of a semiconductor substrate (wafer) showing the mounting method of the multi-beam semiconductor laser device shown in FIG. 16.

First, as shown in FIG. 18, after the semiconductor layer 2 having the convex ridge portion 13 is formed on the main surface of the substrate 11 through the well-known wafer process, the insulating layer 12 is formed on the semiconductor layer 2 except the upper surface of the ridge portion 13, and then the p type electrode 3 is formed on the insulating layer 12.

Figure 19:
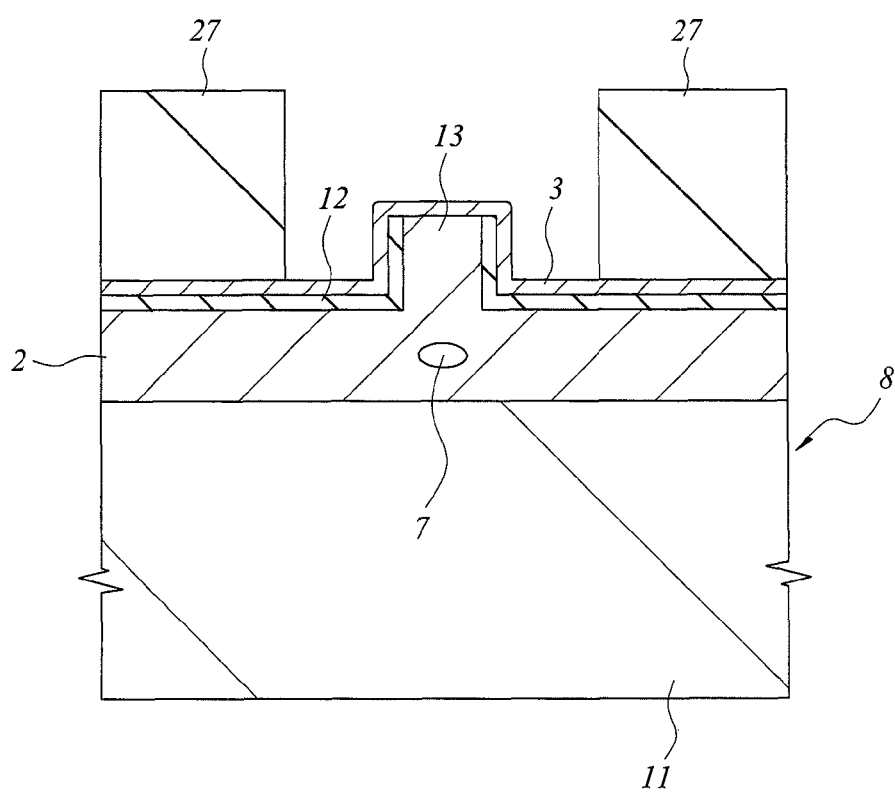
FIG. 19 is a cross-sectional view of the principal part of the semiconductor substrate showing the mounting method of the multi-beam semiconductor laser device continued from FIG. 18.
Figure 20:
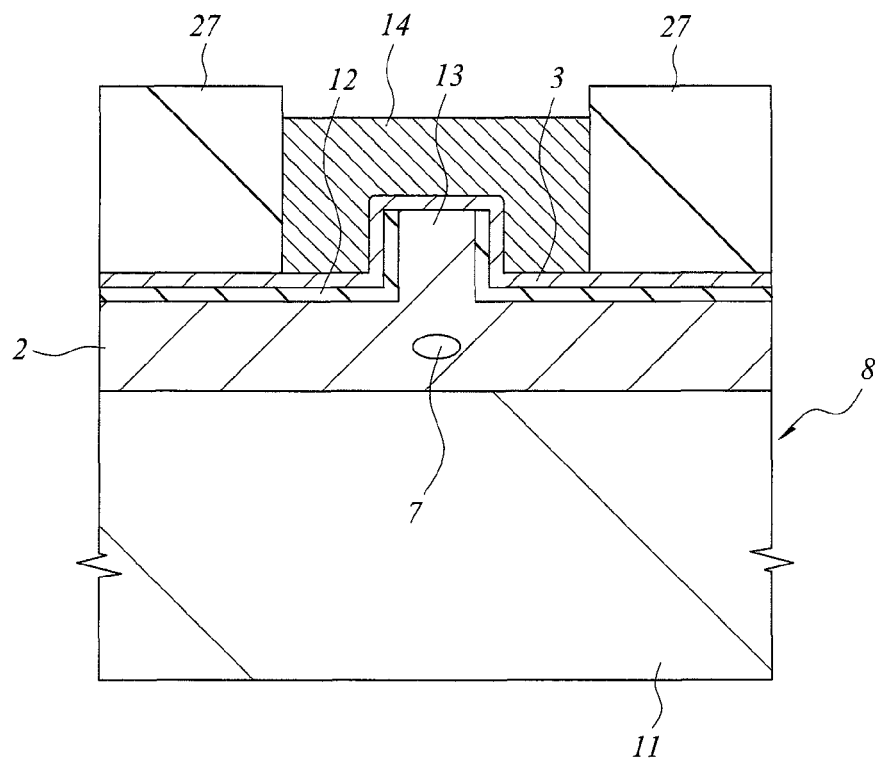
FIG. 20 is a cross-sectional view of the principal part of the semiconductor substrate showing the mounting method of the multi-beam semiconductor laser device continued from FIG. 19.

Next, after a photoresist film 27 having an opening at a position corresponding to a region where the Au plating layer 14 is to be formed is formed on the p type electrode 3 as shown in FIG. 19, the Au plating layer 14 is formed on the p type electrode 3 by using the electroplating method as shown in FIG. 20. At this time, the Au plating layer 14 is formed on the p type electrode 3 in the region not covered with the photoresist film 27.

Figure 21:
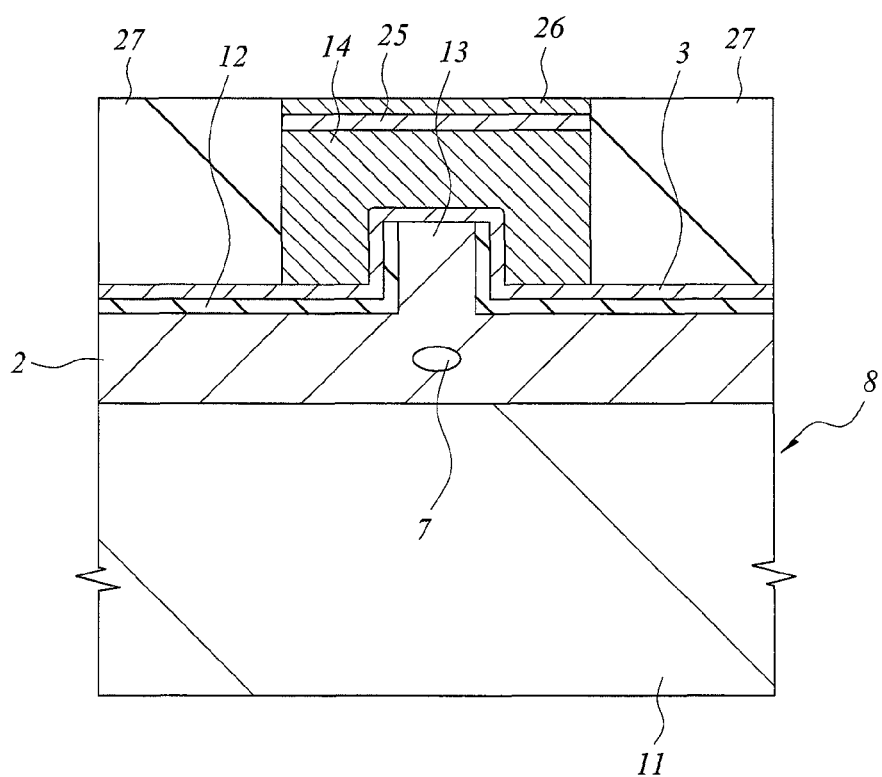
FIG. 21 is a cross-sectional view of the principal part of the semiconductor substrate showing the mounting method of the multi-beam semiconductor laser device continued from FIG. 20.

Next, as shown in FIG. 21, the barrier metal layer 25 constituted of a Ti layer and a Pt layer is formed by deposition on the Au plating layer 14, and then the metal layer 26 made of an Au layer is formed by deposition on this barrier metal layer 25.

Figure 22:
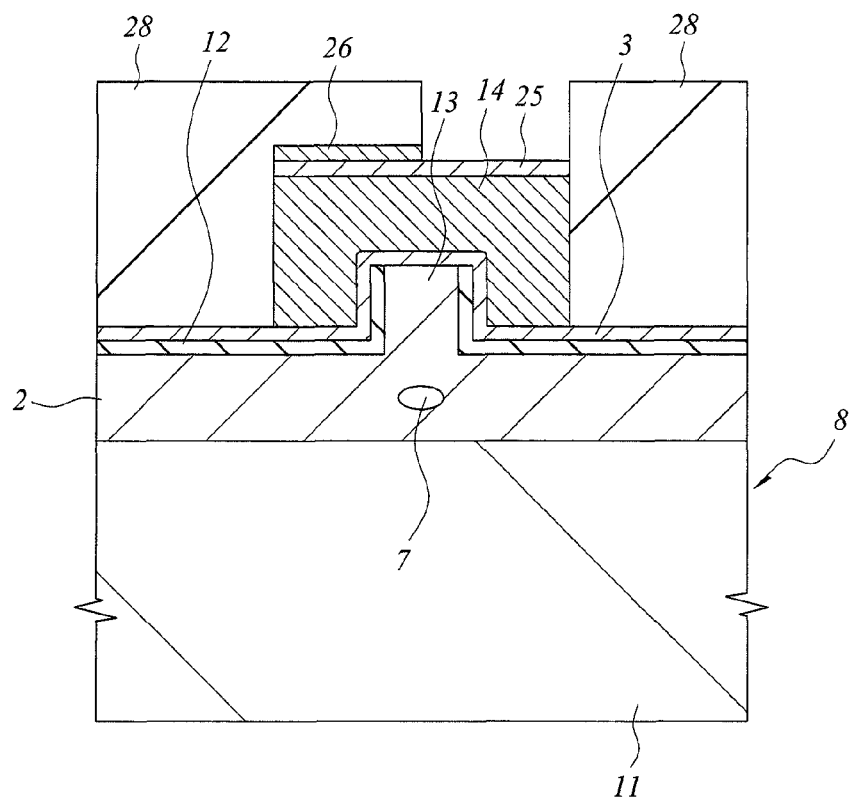
FIG. 22 is a cross-sectional view of the principal part of the semiconductor substrate showing the mounting method of the multi-beam semiconductor laser device continued from FIG. 21.

Next, after the photoresist film 27 is removed, as shown in FIG. 22, a photoresist film 28 through which a part of the metal layer 26 is exposed is formed on the substrate 11, and the metal layer 26 exposed at the bottom of the photoresist film 28 is removed by wet etching.

Figure 23:
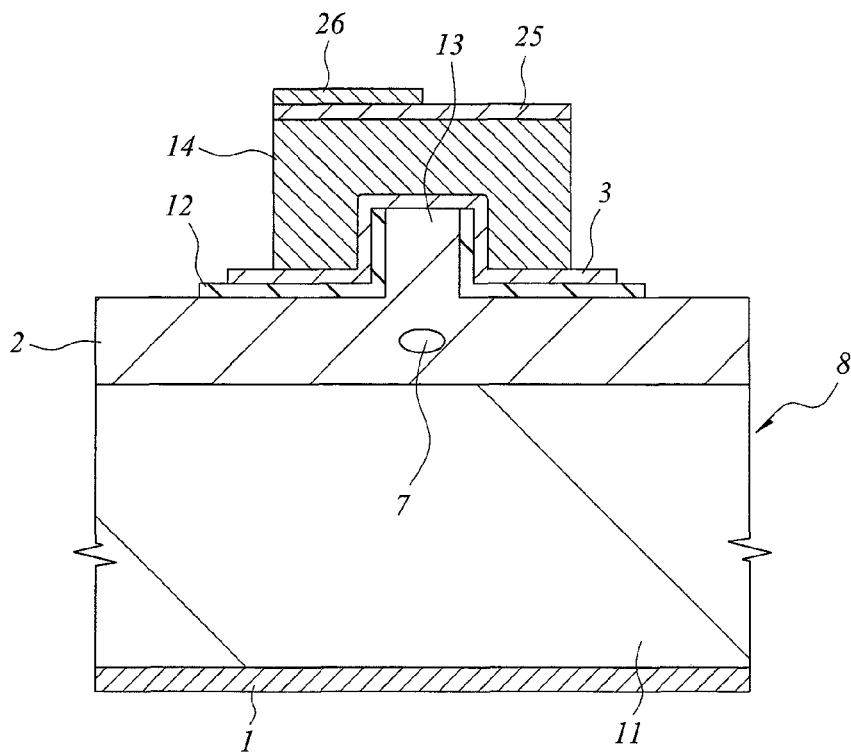
FIG. 23 is a cross-sectional view of the principal part of the semiconductor substrate showing the mounting method of the multi-beam semiconductor laser device continued from FIG. 22.

Next, after the photoresist film 28 is removed, as shown in FIG. 23, the p type electrode 3 is patterned to be separated for each of the elements, and the n type electrode 1 is formed on the rear surface of the substrate 11. Thereafter, the substrate 11 in a wafer state is cleaved and cut into pieces of the laser chip 8, and the laser chip 8 is mounted on the lower surface of the submount 6 with the solder 4, whereby the semiconductor laser device shown in FIG. 16 can be obtained.

Figure 24:
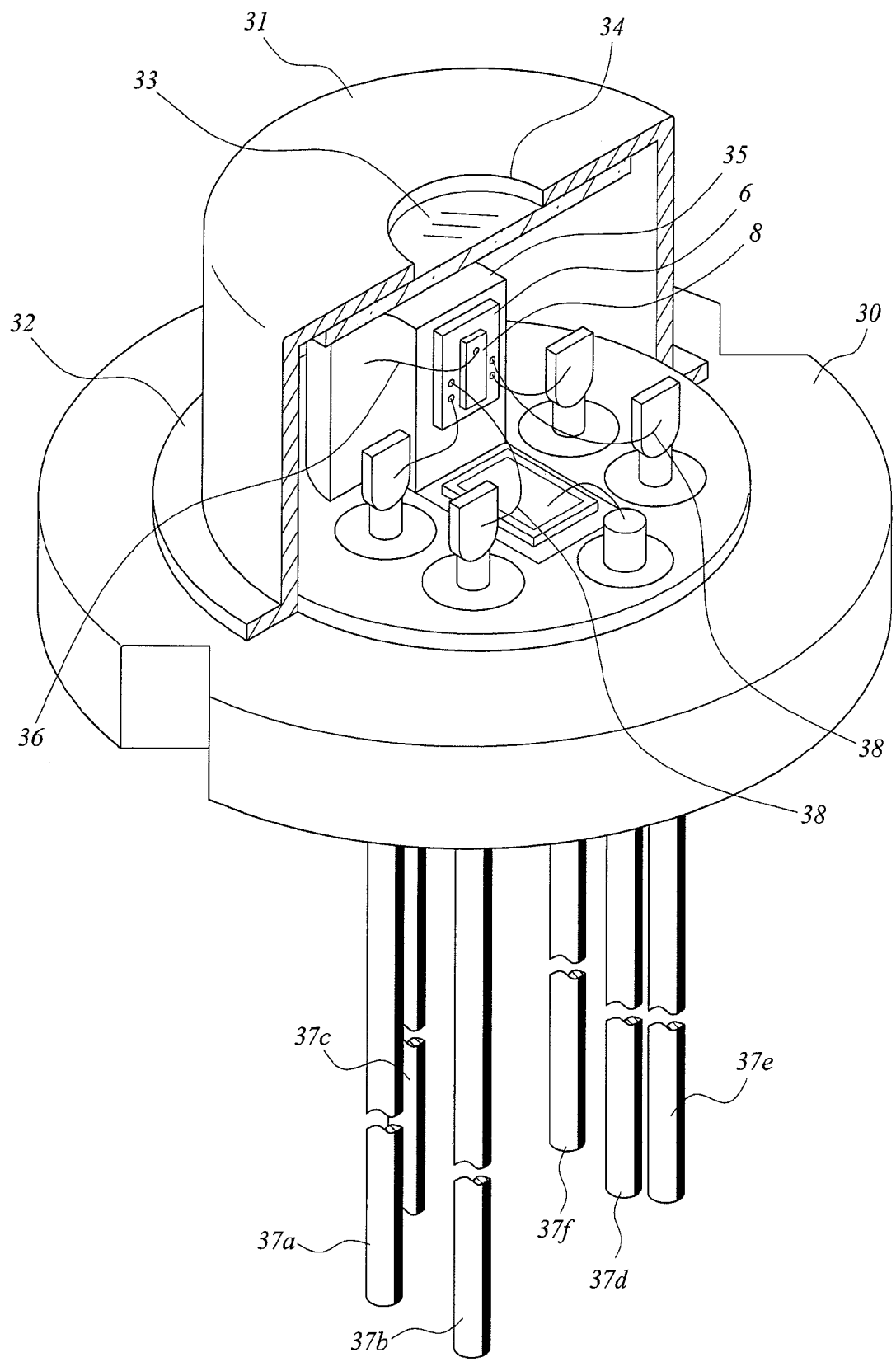
FIG. 24 is a partially exploded perspective view showing the entire structure of the multi-beam semiconductor laser device according to another embodiment of the present invention.
Figure 25:
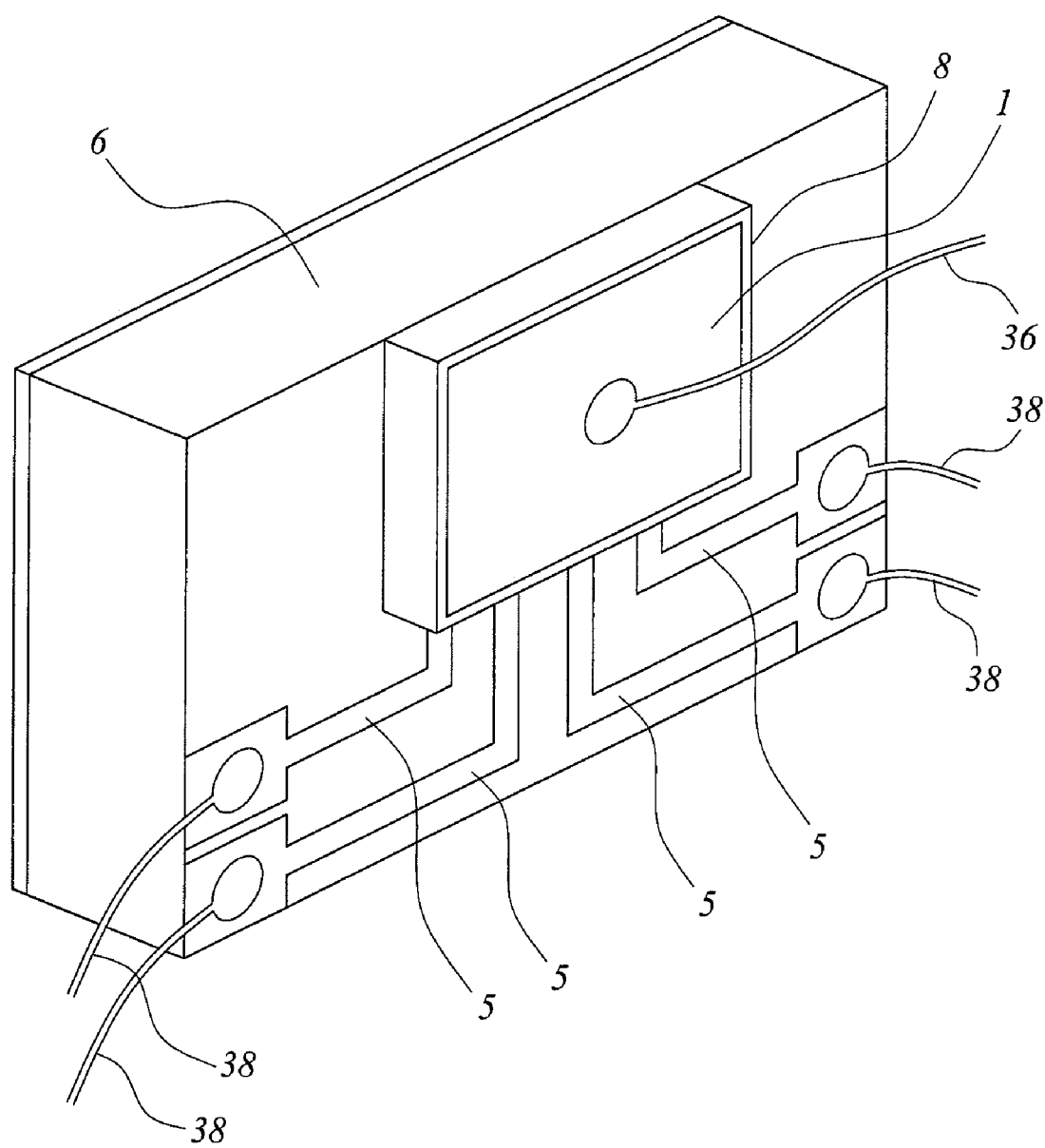
FIG. 25 is a perspective view showing a part of FIG. 24 in an enlarged manner.

FIG. 24 is a partially exploded perspective view showing the entire structure of the multi-beam semiconductor laser device according to the present embodiment and FIG. 25 is a perspective view showing a part of FIG. 24 in an enlarged manner.

The multi-beam semiconductor laser device has a package (sealing container) including a disk-like stem 30 and a cap 31 covering an upper surface of the stem 30, and the laser chip 8 is sealed inside the cap 31. The stem 30 is made of Fe alloy and has a diameter of about 5.6 mm and a thickness of about 1.2 mm. A flange 32 provided on an outer periphery of the bottom portion of the cap 31 is fixed to the upper surface of the stem 30. Also, a circular hole 34 in which a transparent glass plate 33 is bonded is formed at the central part of the upper surface of the cap 31.

A heat sink 35 made of a metal with high thermal conductivity such as Cu is mounted near the center of the upper surface of the stem 30. The heat sink 35 is boned to the upper surface of the stem 30 via a brazing material (not shown). The submount 6 is fixed to one side surface of the heat sink 35 with solder (not shown), and the laser chip 8 is mounted on one surface of this submount 6.

The n type electrode 1 which is not shown in FIG. 24 and FIG. 25 is formed on one surface of the laser chip 8, and this n type electrode 1 and the heat sink 35 are electrically connected to each other by an Au wire 36. More specifically, the laser chip is mounted on the surface of the submount 6 by the junction-down mounting in which the main surface side on which the light-emitting portion 7 is formed is opposed to the submount 6.

The laser chip 8 emits laser light from its both end portions (upper end portion and lower end portion in FIG. 16). Therefore, the submount 6 which supports the laser chip 8 is fixed to the heat sink 35 so that the chip mounting surface is directed to the direction vertical to the upper surface of the stem 30. The laser light emitted from the upper end portion of the laser chip 8 is radiated to the outside through the circular hole 34 of the cap 31.

Six leads 37a, 37b, 37c, 37d, 37e and 37f are attached to the lower surface of the stem 30. Upper end portions of the leads 37a, 37b, 37e and 37f projected to the upper surface side of the stem 30 and the heat sink 35 are electrically connected to each other by Au wires 38. Also, the lead 37c is fixed to the lower surface of the stem 30 and is in an electrically equipotential state with the stem 30.

Fourth Embodiment

Figure 26:
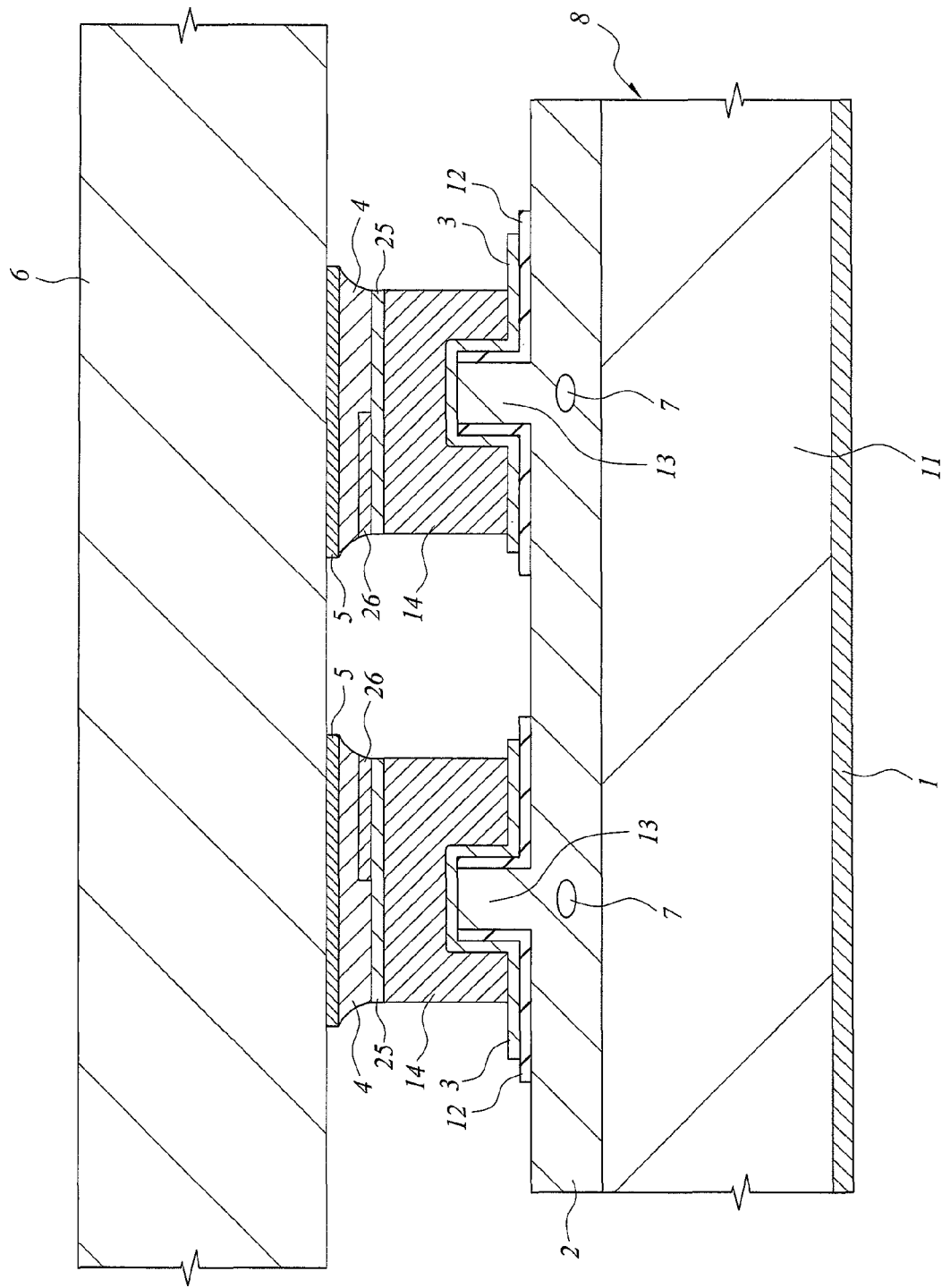
FIG. 26 is a cross-sectional view of the principal part showing the multi-beam semiconductor laser device according to another embodiment of the present invention.

FIG. 26 is a cross-sectional view of the principal part showing the multi-beam semiconductor laser device according to the present embodiment. In the multi-beam semiconductor laser device according to the present embodiment, a part of the solder 4 interposed between the laser chip 8 and the submount 6 is in contact with the barrier metal layer 25 and the other part thereof is in contact with the metal layer 26 like in the third embodiment. In other words, since the metal layer 26 is made of a material having wettability to the solder 4, the contact surfaces of the metal layer 26 and the solder 4 are bonded to each other. On the other hand, since the barrier metal layer 25 is made of a material having no wettability to the solder 4, the contact surfaces of the barrier metal layer 25 and the solder 4 are not bonded to each other though heat and electricity are transmitted.

Also, in the multi-beam semiconductor laser device according to the present embodiment, in addition to the structure described above, the central positions of the Au plating layers 14 in each of the ridge portions 13 are intentionally displaced with respect to the central positions of the underlying light-emitting portions 7. In other words, the Au plating layers 14 are formed so as to be asymmetrical with respect to the central positions of the ridge portions 13 in each of the ridge portions 13.

By this means, the shear strain in a direction opposite to the shear strain applied after the mounting can be applied to the light emitting portions 7 at the stage before the laser chip 8 is mounted on the submount 6. Therefore, the shear strain to be applied to the light-emitting portions 7 after the laser chip 8 is mounted on the submount 6 can be reduced. Accordingly, the multi-beam semiconductor laser device in which the difference in polarization angle between beams is further reduced can be realized.

In the foregoing, the invention made by the inventors of the present invention has been concretely described based on the embodiments. However, it is needless to say that the present invention is not limited to the foregoing embodiments and various modifications and alterations can be made within the scope of the present invention.

Figure 27:
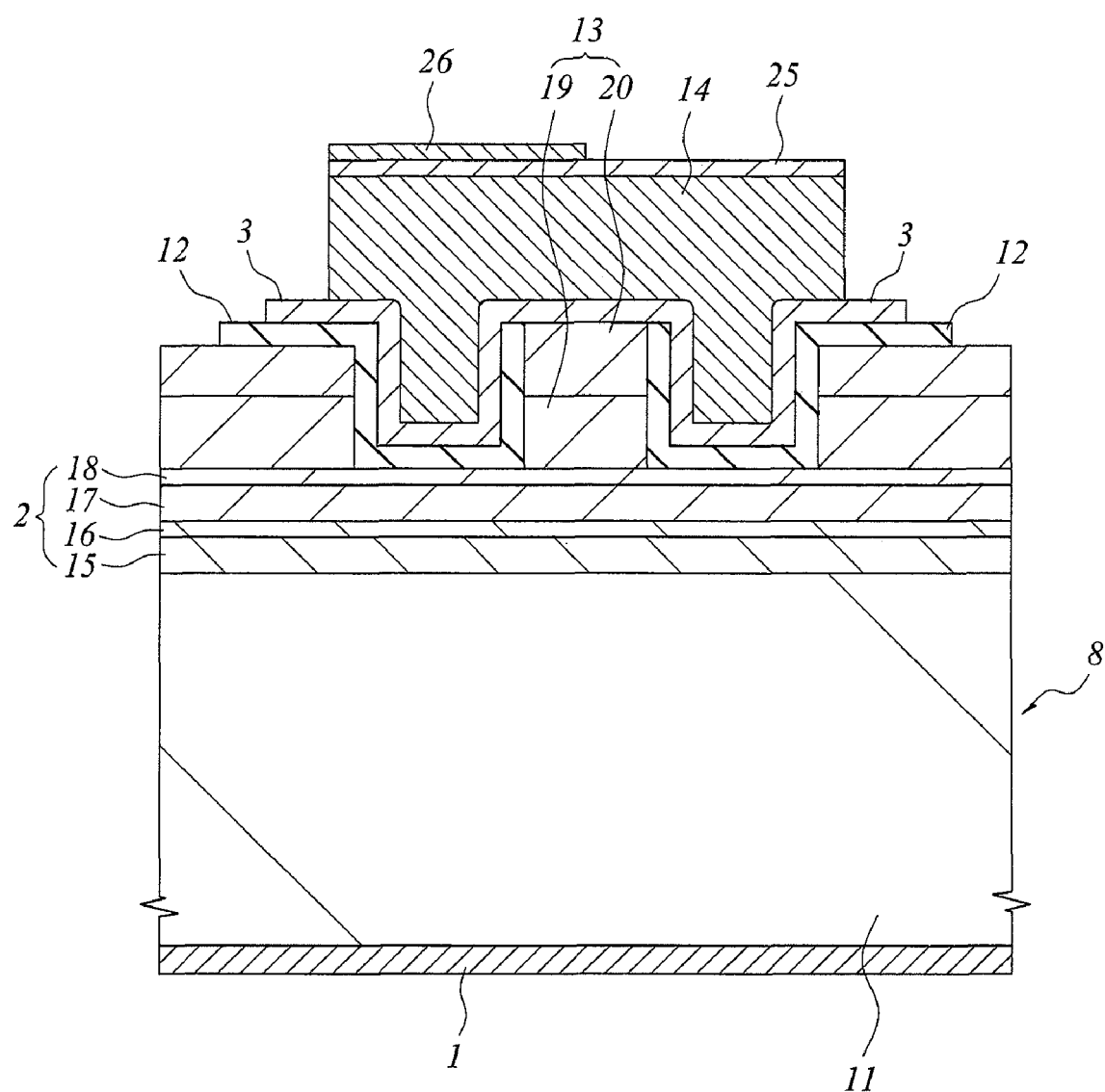
FIG. 27 is a cross-sectional view of the principal part showing another example of the semiconductor chip mounted on the multi-beam semiconductor laser device according to the present invention.

In the embodiments above, the example where the present invention is applied to the multi-beam semiconductor laser device having the laser chip 8 including the convex ridge portions 13 has been described. Other than that, the present invention can be applied to the multi-beam semiconductor laser device having the laser chip 8 in which the p type second clad layer 19 and the p type contact layer 20 are present on the p type etching stop layer 18 in the region outside the ridge portion 13 as shown in FIG. 27.

Further, in the embodiments above, the Au plating layer 14 is formed on the surface of the p type electrode 3 of the laser chip 8, the barrier metal layer 25 made of a Ti layer/Pt layer having no wettability to the solder 4 made of Au—Sn alloy is formed on the surface of the Au plating layer 14, and the metal layer 26 made of Au having wettability to the solder 4 is formed on a part of the surface of the barrier metal layer 25. However, the materials of the plating layer, the solder, the metal layer and the barrier metal layer are not limited to those described above.

Further, in the embodiments above, the example where the present invention is applied to the two-beam semiconductor laser device having two light-emitting portions has been described. However, the present invention can be of course applied to the multi-beam semiconductor laser device having three or more light-emitting portions.

Further, in the embodiments above, the example where the present invention is applied to the multi-beam semiconductor laser device in which the linear expansion coefficient of the substrate 11 is smaller than that of the submount 6 has been described. However, the present invention can be of course applied to the multi-beam semiconductor laser device in which the linear expansion coefficient of the substrate 11 is larger than that of the submount 6. A multi-beam semiconductor laser device in which a laser chip made of GaAs is mounted on a submount made of CuW (linear expansion coefficient=$6.5\times10^{-6}$/K to $8.3\times10^{-6}$/K) can be taken as an example of such a multi-beam semiconductor laser device.

Further, in the embodiments above, the example where the present invention is applied to the multi-beam semiconductor laser device having a plurality of light-emitting portions has been described. However, the present invention can be applied to the single-beam semiconductor laser device having a single light-emitting portion. More specifically, although the problem of the difference in polarization angel between beams does not occur in the single-beam semiconductor laser device, the structure of the present invention for controlling the ratio of "contact area between a metal layer and solder: contact area between a barrier metal layer and solder" can be applied as correction means when a central value of the polarization angle is displaced from 0 (zero) due to the manufacturing variation.

The present invention can be effectively applied to a multi-beam semiconductor laser device.

What is claimed is:

1. A semiconductor laser device comprising:
    a semiconductor laser element array with a multi-beam structure including a semiconductor substrate, a cathode electrode of a first conductivity type formed on a first surface of the semiconductor substrate, a semiconductor layer formed on a second surface of the semiconductor substrate and having a plurality of light-emitting portions therein, anode electrodes of a second conductivity type formed above each of the plurality of light-emitting portions, and metal layers formed on each surface of the anode electrodes,
    wherein each of the metal layers is bonded to a first surface of a submount via a bonding material, thereby mounting the semiconductor laser element array on the submount, and
    central positions of the metal layers in a width direction are intentionally displaced with respect to central positions of the underlying light-emitting portions in a width direction.

2. The semiconductor laser device according to claim 1, wherein a linear expansion coefficient of the semiconductor substrate is larger than a linear expansion coefficient of the submount, and central positions of the metal layers in a width direction are intentionally displaced with respect to central positions of the light-emitting portions in a width direction so that plus shear strain is applied to the light-emitting portions located on a left side with respect to a central position of the semiconductor substrate in a width direction and minus shear strain is applied to the light emitting portions located on a right side at a stage before the semiconductor laser element array is mounted on the submount.

3. The semiconductor laser device according to claim 2, wherein the semiconductor substrate is made of GaAs, and the submount is made of SiC or AlN.

4. The semiconductor laser device according to claim 1, wherein a linear expansion coefficient of the semiconductor substrate is smaller than a linear expansion coefficient of the submount, and central positions of the metal layers in a width direction are intentionally displaced with respect to central positions of the light-emitting portions in a width direction so that minus shear strain is applied to the light-emitting portions located on a left side with respect to a central position of the semiconductor substrate in a width direction and plus shear strain is applied to the light emitting portions located on a right side at a stage before the semiconductor laser element array is mounted on the submount.

5. The semiconductor laser device according to claim 4, wherein the semiconductor substrate is made of GaAs, and the submount is made of CuW.

6. The semiconductor laser device according to claim 1, wherein, assuming that a width of the metal layer is Wa and a width of the light emitting portion is Wb, an upper limit of the displacement is (Wa−4Wb)/2.

7. The semiconductor laser device according to claim 1, wherein, when the number of beams is four or more, a central position of the metal layer in a width direction located at a position farther from a center of the semiconductor substrate in a width direction is more largely displaced with respect to a central position of the underlying light-emitting portion in a width direction.

8. The semiconductor laser device according to claim 1, wherein, when the number of beams is odd, the amount of displacement between a central position of the metal layer in a width direction located at a center of the semiconductor substrate in a width direction and a central position of the underlying light-emitting portion in a width direction is 0.

9. The semiconductor laser device according to claim 1, wherein a pseudo laser element which does not have a light-emitting portion is provided outside a region where the plurality of light-emitting portions and the plurality of metal layers are formed.

10. The semiconductor laser device according to claim 1, wherein a heat sink is bonded to a second surface of the submount.

11. The semiconductor laser device according to claim 1, wherein the metal layer is an Au plating layer.

* * * * *